United States Patent
Roy

(10) Patent No.: US 11,825,627 B2
(45) Date of Patent: Nov. 21, 2023

(54) VENTILATION AND AIR FLOW CONTROL WITH HEAT INSULATED COMPARTMENT

(71) Applicant: Switch, Ltd., Las Vegas, NV (US)

(72) Inventor: Rob Roy, Las Vegas, NV (US)

(73) Assignee: Switch, Ltd., Las Vegas, NV (US)

( * ) Notice: Subject to any disclaimer, the term of this patent is extended or adjusted under 35 U.S.C. 154(b) by 0 days.

(21) Appl. No.: 17/745,862

(22) Filed: May 16, 2022

(65) Prior Publication Data

US 2022/0354016 A1 Nov. 3, 2022

Related U.S. Application Data

(63) Continuation of application No. 16/147,294, filed on Sep. 28, 2018, now Pat. No. 11,350,542, which is a continuation of application No. 15/705,125, filed on Sep. 14, 2017, now abandoned.

(60) Provisional application No. 62/394,680, filed on Sep. 14, 2016.

(51) Int. Cl.
H05K 7/20 (2006.01)

(52) U.S. Cl.
CPC ..... *H05K 7/20181* (2013.01); *H05K 7/20745* (2013.01)

(58) Field of Classification Search
CPC ............ H05K 7/20181; H05K 7/20745
USPC .......................................... 454/184
See application file for complete search history.

(56) References Cited

U.S. PATENT DOCUMENTS

| | | |
|---|---|---|
| 2,330,769 A | 9/1943 | Wichner |
| 2,407,217 A | 9/1946 | Banneyer |
| 2,880,949 A | 4/1959 | Fuss |
| 2,891,750 A | 6/1959 | Bergquist |
| 3,192,306 A | 6/1965 | Skonnord |
| 3,202,580 A | 8/1965 | Bell |

(Continued)

FOREIGN PATENT DOCUMENTS

| | | |
|---|---|---|
| GB | 2228024 A | 8/1990 |
| WO | WO02052107 | 7/2002 |
| WO | WO 2011/146063 | 11/2011 |

OTHER PUBLICATIONS

International Search Report dated Aug. 7, 2014 in corresponding PCT/US14/30716.

(Continued)

*Primary Examiner* — Edelmira Bosques
*Assistant Examiner* — Dana K Tighe
(74) *Attorney, Agent, or Firm* — Weide & Miller, Ltd.

(57) ABSTRACT

Disclosed is an electrical cabinet with associated air flow direction and heat separation control system. The cabinet has a front, rear, a first side and a second side. The front side has openings to accept flow of cool air into the cabinet and the rear side has openings for exit of warm air from the rear side of the cabinet. The front, rear, first side and second side define an interior space are configured to house heat generating electrical equipment. A frame is adjacent the rear side of the cabinet. The frame has a first frame side and a second frame side. Louvers are located adjacent the rear of the cabinet. The louvers extend between the first frame side and the second frame side. Each louver has a face positioned at an angle to direct the warm air exiting the cabinet other than perpendicular to the rear of the cabinet. A first compartment for storing heat generating equipment is positioned above or below a thermally separated second compartment for storing heat sensitive equipment.

20 Claims, 19 Drawing Sheets

(56) References Cited

U.S. PATENT DOCUMENTS

| | | |
|---|---|---|
| 3,513,326 A | 5/1970 | Potts |
| 3,521,843 A | 7/1970 | Ogle |
| 3,563,882 A | 2/1971 | Kimura et al. |
| 3,840,124 A | 10/1974 | Atwater |
| 3,985,957 A | 10/1976 | Torn |
| 4,028,293 A | 6/1977 | Van Den Berg |
| 4,073,099 A | 2/1978 | Van Der et al. |
| 4,102,463 A | 7/1978 | Schmidt |
| 4,118,608 A | 10/1978 | Kussy |
| 4,158,754 A | 6/1979 | Yonezaki et al. |
| 4,171,029 A | 10/1979 | Beale |
| 4,189,990 A | 2/1980 | Kittler |
| 4,233,858 A | 11/1980 | Rowlett |
| 4,258,271 A | 3/1981 | Chappell |
| 4,320,261 A | 3/1982 | Scerbo et al. |
| 4,434,390 A | 2/1984 | Elms |
| 4,453,117 A | 6/1984 | Elms |
| 4,456,867 A | 6/1984 | Mallick et al. |
| 4,461,986 A | 7/1984 | Maynard et al. |
| 4,467,260 A | 8/1984 | Mallick |
| 4,472,920 A | 9/1984 | Simpson |
| 4,476,423 A | 10/1984 | Mallick |
| 4,528,789 A | 7/1985 | Simpson |
| 4,548,164 A | 10/1985 | Ylonen et al. |
| 4,602,468 A | 7/1986 | Simpson |
| 4,620,397 A | 11/1986 | Simpson et al. |
| 4,663,911 A | 5/1987 | Gracia |
| 4,797,783 A | 1/1989 | Kohmoto |
| 4,996,909 A | 3/1991 | Vache et al. |
| 5,003,867 A | 4/1991 | Sodec et al. |
| 5,005,323 A | 4/1991 | Simpson et al. |
| 5,142,838 A | 9/1992 | Simpson |
| 5,223,643 A | 6/1993 | Bohm et al. |
| 5,237,484 A | 8/1993 | Ferchau |
| 5,271,585 A | 12/1993 | Zetena |
| 5,312,296 A | 5/1994 | Aalto et al. |
| 5,322,646 A | 6/1994 | Wright et al. |
| 5,438,781 A | 8/1995 | Landmann |
| 5,473,114 A | 12/1995 | Vogel |
| 5,544,012 A | 8/1996 | Koike |
| 5,545,086 A | 8/1996 | Sharp |
| 5,570,740 A | 11/1996 | Flores et al. |
| 5,600,924 A | 2/1997 | Forsberg |
| 5,657,641 A | 8/1997 | Cunningham et al. |
| 5,704,170 A | 1/1998 | Simpson |
| 5,743,063 A | 4/1998 | Boozer |
| 5,769,365 A | 6/1998 | Onishi |
| 5,784,847 A | 7/1998 | Wiklund |
| 5,852,904 A | 12/1998 | Yu et al. |
| 5,857,292 A | 1/1999 | Simpson |
| 5,875,592 A | 3/1999 | Allman et al. |
| 5,880,544 A | 3/1999 | Ikeda |
| 5,885,154 A | 3/1999 | Napadow et al. |
| 5,941,767 A | 8/1999 | Fukuda et al. |
| 5,969,292 A | 10/1999 | Snider et al. |
| 6,034,873 A | 3/2000 | Stahl et al. |
| 6,079,941 A | 6/2000 | Lee |
| 6,129,316 A | 10/2000 | Bauer |
| 6,150,736 A | 11/2000 | Brill |
| 6,224,016 B1 | 5/2001 | Lee et al. |
| 6,231,704 B1 | 5/2001 | Carpinetti |
| 6,301,853 B1 | 10/2001 | Simpson et al. |
| 6,365,830 B1 | 4/2002 | Snider, Jr. |
| 6,374,627 B1 | 4/2002 | Schumacher |
| 6,394,398 B1 | 5/2002 | Reed |
| 6,407,533 B1 | 6/2002 | Bartek et al. |
| 6,412,260 B1 | 7/2002 | Lukac |
| 6,412,292 B2 | 7/2002 | Spinazzola et al. |
| 6,427,454 B1 | 8/2002 | West |
| 6,437,243 B1 | 8/2002 | VanderVelde |
| 6,453,055 B1 | 9/2002 | Fukumura et al. |
| 6,481,527 B1 | 11/2002 | French et al. |
| 6,506,110 B1 | 1/2003 | Borisch |
| 6,515,224 B1 | 2/2003 | Pedro |
| 6,535,382 B2 | 3/2003 | Bishop et al. |
| 6,541,704 B1 | 4/2003 | Levenson et al. |
| 6,566,775 B1 | 5/2003 | Fradella |
| 6,567,769 B2 | 5/2003 | Chang |
| 6,574,970 B2 | 6/2003 | Spinazzola et al. |
| 6,592,448 B1 | 7/2003 | Williams |
| 6,597,670 B1 | 7/2003 | Tweedy et al. |
| 6,616,524 B2 | 9/2003 | Storck, Jr. et al. |
| 6,672,955 B2 | 1/2004 | Charron |
| 6,707,688 B2 | 3/2004 | Reyes et al. |
| 6,722,151 B2 | 4/2004 | Spinazzola et al. |
| 6,742,942 B2 | 6/2004 | Hering et al. |
| 6,745,579 B2 | 6/2004 | Spinazzola et al. |
| 6,794,777 B1 | 9/2004 | Fradella |
| 6,817,688 B2 | 11/2004 | O'Halloran |
| 6,822,859 B2 | 11/2004 | Coglitore et al. |
| 6,824,150 B2 | 11/2004 | Simione |
| 6,833,991 B2 | 12/2004 | Van Gaal |
| 6,846,132 B2 | 1/2005 | Kennedy et al. |
| 6,848,267 B2 | 2/2005 | Pierson |
| 6,859,366 B2 | 2/2005 | Fink et al. |
| 6,862,179 B2 | 3/2005 | Beitelmal et al. |
| 6,867,967 B2 | 3/2005 | Mok |
| 6,897,587 B1 | 5/2005 | McMullen |
| 6,910,497 B2 | 6/2005 | Bernard |
| 6,967,283 B2 | 11/2005 | Rasmussen et al. |
| 6,980,433 B2 | 12/2005 | Fink et al. |
| 6,981,915 B2 | 1/2006 | Moore et al. |
| 7,003,374 B2 | 2/2006 | Olin et al. |
| 7,031,154 B2 | 4/2006 | Bash |
| 7,033,267 B2 | 4/2006 | Rasmussen et al. |
| 7,042,722 B2 | 5/2006 | Suzuki et al. |
| 7,061,715 B2 | 6/2006 | Miyamoto |
| 7,085,133 B2 | 8/2006 | Hall |
| 7,100,827 B2 | 9/2006 | Olin et al. |
| 7,128,138 B2 | 10/2006 | Des Champs |
| 7,187,265 B1 | 3/2007 | Senogles et al. |
| 7,232,236 B2 | 6/2007 | Vitense et al. |
| 7,278,273 B1 | 10/2007 | Witted |
| 7,315,448 B1 | 1/2008 | Bash et al. |
| 7,369,741 B2 | 5/2008 | Reagan et al. |
| 7,372,695 B2 | 5/2008 | Coglitore |
| 7,430,118 B1 | 9/2008 | Noteboom et al. |
| 7,448,945 B2 | 11/2008 | Bessent |
| 7,477,514 B2 | 1/2009 | Campbell et al. |
| 7,486,511 B1 | 2/2009 | Griffel et al. |
| 7,500,911 B2 | 3/2009 | Johnson et al. |
| 7,505,849 B2 | 3/2009 | Saarikivi |
| 7,508,663 B2 | 3/2009 | Coglitore et al. |
| 7,511,959 B2 | 3/2009 | Belady |
| 7,542,287 B2 | 6/2009 | Lewis et al. |
| 7,568,360 B1 | 8/2009 | Bash et al. |
| 7,574,839 B1 | 8/2009 | Simpson |
| 7,601,922 B2 | 10/2009 | Larsen et al. |
| 7,604,535 B2 | 10/2009 | Germagian et al. |
| 7,641,546 B2 | 1/2010 | Bok et al. |
| 7,643,291 B2 | 1/2010 | Mallia et al. |
| 7,656,660 B2 | 2/2010 | Hoeft |
| 7,667,965 B2 | 2/2010 | Nobile |
| 7,675,747 B1 | 3/2010 | Ong et al. |
| 7,684,193 B2 | 3/2010 | Fink et al. |
| 7,688,578 B2 | 3/2010 | Mann et al. |
| 7,716,829 B2 | 5/2010 | Des Champs et al. |
| 7,778,030 B1 | 8/2010 | Chiriac |
| 7,787,260 B2 | 8/2010 | Hruby et al. |
| 7,789,359 B2 | 9/2010 | Chopp et al. |
| 7,804,685 B2 | 9/2010 | Krietzman et al. |
| 7,804,690 B2 | 9/2010 | Huang et al. |
| 7,841,199 B2 | 11/2010 | Vangilder et al. |
| 7,862,410 B2 | 1/2011 | McMahan et al. |
| 7,881,310 B2 | 2/2011 | Kandlur et al. |
| 7,894,190 B2 | 2/2011 | Davis et al. |
| 7,903,407 B2 | 3/2011 | Matsushima et al. |
| 7,944,692 B2 | 5/2011 | Grantham et al. |
| 7,954,070 B2 | 5/2011 | Plocher et al. |
| 7,957,139 B2 | 6/2011 | Davis et al. |
| 7,971,446 B2 | 7/2011 | Clidaras |
| 7,983,038 B2 | 7/2011 | Levesque |
| 8,037,644 B2 | 10/2011 | Hall |
| 8,040,673 B2 | 10/2011 | Krietzman |

(56) References Cited

U.S. PATENT DOCUMENTS

| | | |
|---|---|---|
| 8,061,087 B2 | 11/2011 | Ray |
| 8,072,780 B1 | 12/2011 | Roy |
| 8,113,010 B2 | 2/2012 | Carlson |
| 8,144,467 B2 | 3/2012 | Campbell et al. |
| 8,154,870 B1 | 4/2012 | Czamara et al. |
| 8,159,820 B2 | 4/2012 | Ibori et al. |
| 8,180,495 B1 | 5/2012 | Roy |
| 8,209,056 B2 | 6/2012 | Rasmussen et al. |
| 8,209,993 B2 | 7/2012 | Carlson et al. |
| 8,223,495 B1 | 7/2012 | Carlson et al. |
| 8,257,155 B2 | 9/2012 | Lewis |
| 8,257,156 B2 | 9/2012 | Shabany |
| 8,276,397 B1 | 10/2012 | Carlson et al. |
| 8,282,451 B2 | 10/2012 | Taylor |
| 8,300,410 B2 | 10/2012 | Slessman |
| 8,310,832 B2 | 11/2012 | Vanderveen et al. |
| 8,346,398 B2 | 1/2013 | Ahmed et al. |
| 8,395,891 B2 | 3/2013 | Noteboom et al. |
| 8,469,782 B1 | 6/2013 | Roy |
| 8,493,732 B2 | 7/2013 | Lineal et al. |
| 8,498,114 B2 | 7/2013 | Martini |
| 8,509,960 B2 | 8/2013 | Tai et al. |
| 8,514,572 B2 | 8/2013 | Rogers |
| 8,553,409 B2 | 10/2013 | Rehmann et al. |
| 8,574,046 B2 | 11/2013 | Nishiyama et al. |
| 8,583,290 B2 | 11/2013 | Campbell et al. |
| 8,587,941 B2 | 11/2013 | Julien-Roux |
| 8,601,827 B2 | 12/2013 | Keisling et al. |
| 8,636,565 B2 | 1/2014 | Carlson et al. |
| 8,705,233 B2 | 4/2014 | Rehmann et al. |
| 8,782,234 B2 | 7/2014 | Pienta et al. |
| 8,806,238 B2 | 8/2014 | Jau |
| 8,824,142 B2 | 9/2014 | Jewell |
| 8,845,403 B2 | 9/2014 | Archibald |
| 8,853,872 B2 | 10/2014 | Clidaras et al. |
| 9,021,821 B2 | 5/2015 | Dunnavant |
| 9,032,742 B2 | 5/2015 | Dunnavant |
| 9,055,696 B2 | 6/2015 | Dunnavant |
| 9,104,387 B1 | 8/2015 | Eichelberg |
| 9,119,326 B2 | 8/2015 | McDonnell et al. |
| 9,121,618 B2 | 9/2015 | Fisher et al. |
| 9,204,578 B2 | 12/2015 | Smith |
| 9,282,684 B2 | 3/2016 | Keisling et al. |
| 9,301,432 B2 | 3/2016 | Nelson et al. |
| 9,313,927 B2 | 4/2016 | Krietzman |
| 9,363,925 B2 | 6/2016 | Czamara |
| 9,560,777 B2 | 1/2017 | Krietzman et al. |
| 9,591,790 B2 | 3/2017 | Eichelberg |
| 9,606,588 B2 | 3/2017 | Dean et al. |
| 9,618,784 B2 | 4/2017 | Keisling et al. |
| 9,629,285 B1 | 4/2017 | Lachapelle et al. |
| 9,877,414 B2 | 1/2018 | Vorreiter |
| 1,363,407 A1 | 12/2020 | Goudie |
| 2001/0029163 A1 | 10/2001 | Spinazzola et al. |
| 2002/0005457 A1 | 1/2002 | Lee et al. |
| 2002/0059804 A1 | 5/2002 | Spinazzola et al. |
| 2002/0108386 A1 | 8/2002 | Spinazzola et al. |
| 2002/0121555 A1 | 9/2002 | Cipolla et al. |
| 2003/0050003 A1 | 3/2003 | Charron |
| 2003/0066638 A1 | 4/2003 | Qu |
| 2003/0122379 A1 | 7/2003 | Woods |
| 2003/0124971 A1 | 7/2003 | Williams |
| 2003/0143942 A1 | 7/2003 | Kennedy et al. |
| 2003/0181158 A1 | 9/2003 | Schell et al. |
| 2003/0183955 A1 | 10/2003 | Fields |
| 2003/0209023 A1 | 11/2003 | Spinazzola et al. |
| 2003/0231881 A1 | 12/2003 | Hering et al. |
| 2004/0004813 A1 | 1/2004 | Coglitore et al. |
| 2004/0050231 A1 | 3/2004 | Chu |
| 2004/0099747 A1 | 5/2004 | Johnson et al. |
| 2004/0118137 A1 | 6/2004 | Patel et al. |
| 2004/0148934 A1 | 8/2004 | Pinkerton |
| 2004/0217072 A1 | 11/2004 | Bash et al. |
| 2004/0218355 A1 | 11/2004 | Bash et al. |
| 2005/0024826 A1 | 2/2005 | Bash |
| 2005/0034468 A1 | 2/2005 | Dietz |
| 2005/0099770 A1 | 5/2005 | Fink et al. |
| 2005/0167135 A1 | 8/2005 | Jackson |
| 2005/0170770 A1 | 8/2005 | Johnson et al. |
| 2005/0225936 A1 | 10/2005 | Day |
| 2005/0245132 A1 | 11/2005 | Huang et al. |
| 2005/0246057 A1 | 11/2005 | Olin et al. |
| 2005/0278070 A1 | 12/2005 | Bash et al. |
| 2006/0021786 A1 | 2/2006 | Fetterolf et al. |
| 2006/0026954 A1 | 2/2006 | Truong |
| 2006/0055175 A1 | 3/2006 | Grinblat |
| 2006/0056127 A1 | 3/2006 | Lewis |
| 2006/0066163 A1 | 3/2006 | Melfi |
| 2006/0072277 A1 | 4/2006 | Schmidt et al. |
| 2006/0082263 A1 | 4/2006 | Rimler et al. |
| 2006/0146520 A1 | 7/2006 | Vitense et al. |
| 2006/0158037 A1 | 7/2006 | Danley |
| 2006/0185931 A1 | 8/2006 | Kawar |
| 2006/0187636 A1 | 8/2006 | Fink et al. |
| 2006/0236487 A1 | 10/2006 | Dean |
| 2006/0260338 A1 | 11/2006 | Van Gilder et al. |
| 2006/0276121 A1 | 12/2006 | Rasmussen et al. |
| 2006/0277501 A1 | 12/2006 | Plocher et al. |
| 2006/0281061 A1 | 12/2006 | Hightower |
| 2007/0021050 A1 | 1/2007 | Kennedy et al. |
| 2007/0032979 A1 | 2/2007 | Hamann et al. |
| 2007/0040263 A1 | 2/2007 | Towada |
| 2007/0064389 A1 | 3/2007 | Lewis, II et al. |
| 2007/0078635 A1 | 4/2007 | Rasmussen et al. |
| 2007/0082195 A1 | 4/2007 | Goecke et al. |
| 2007/0094946 A1 | 5/2007 | Schoeny |
| 2007/0105445 A1 | 5/2007 | Manto et al. |
| 2007/0129000 A1 | 6/2007 | Rasmussen et al. |
| 2007/0135032 A1 | 6/2007 | Wang |
| 2007/0146994 A1 | 6/2007 | Germagian |
| 2007/0171613 A1 | 7/2007 | McMahan et al. |
| 2007/0211443 A1 | 9/2007 | Wechter et al. |
| 2007/0213000 A1 | 9/2007 | Day |
| 2007/0243425 A1 | 10/2007 | Spaner |
| 2007/0253181 A1 | 11/2007 | Bersiek |
| 2007/0267247 A1 | 11/2007 | Tartsch |
| 2007/0274043 A1 | 11/2007 | Shabany |
| 2008/0029250 A1 | 2/2008 | Carlson et al. |
| 2008/0035810 A1 | 2/2008 | Lewis |
| 2008/0055848 A1 | 3/2008 | Hamburgen et al. |
| 2008/0055850 A1 | 3/2008 | Carlson et al. |
| 2008/0094797 A1 | 4/2008 | Coglitore |
| 2008/0137266 A1 | 6/2008 | Jensen |
| 2008/0185363 A1 | 8/2008 | Yu et al. |
| 2008/0264688 A1 | 10/2008 | Chopp et al. |
| 2008/0299890 A1 | 12/2008 | Orrell |
| 2008/0305733 A1 | 12/2008 | Noteboom et al. |
| 2009/0051545 A1 | 2/2009 | Koblasz |
| 2009/0061756 A1 | 3/2009 | Germagian et al. |
| 2009/0064551 A1 | 3/2009 | Schroder et al. |
| 2009/0195977 A1 | 8/2009 | Fink et al. |
| 2009/0197684 A1 | 8/2009 | Arezina et al. |
| 2009/0228726 A1 | 9/2009 | Malik |
| 2009/0229510 A1 | 9/2009 | Sutter |
| 2009/0235097 A1 | 9/2009 | Hamilton |
| 2009/0237461 A1 | 9/2009 | Silverbrook et al. |
| 2009/0239460 A1 | 9/2009 | Luciat et al. |
| 2009/0241578 A1 | 10/2009 | Carlson |
| 2009/0277605 A1 | 11/2009 | Vangilder et al. |
| 2009/0308579 A1 | 12/2009 | Johnson et al. |
| 2009/0319650 A1 | 12/2009 | Collins |
| 2009/0326721 A1 | 12/2009 | Sugiyama |
| 2010/0003911 A1 | 1/2010 | Graczyk et al. |
| 2010/0016730 A1 | 1/2010 | Tanaka et al. |
| 2010/0028610 A1 | 2/2010 | Caveney et al. |
| 2010/0048119 A1 | 2/2010 | Tashiro |
| 2010/0061057 A1 | 3/2010 | Dersch |
| 2010/0061059 A1 | 3/2010 | Krietzman et al. |
| 2010/0110626 A1 | 5/2010 | Schmitt et al. |
| 2010/0136895 A1 | 6/2010 | Sgro |
| 2010/0139887 A1 | 6/2010 | Slessman |
| 2010/0144265 A1 | 6/2010 | Bednarcik et al. |
| 2010/0151781 A1 | 6/2010 | Slessman et al. |
| 2010/0154448 A1 | 6/2010 | hay |

(56) References Cited

U.S. PATENT DOCUMENTS

| | | |
|---|---|---|
| 2010/0165565 A1 | 7/2010 | Hellriegal et al. |
| 2010/0165572 A1 | 7/2010 | Fink et al. |
| 2010/0170277 A1 | 7/2010 | Schmitt et al. |
| 2010/0187832 A1 | 7/2010 | Holland |
| 2010/0190430 A1 | 7/2010 | Rodriguez et al. |
| 2010/0201230 A1 | 8/2010 | Schweitzer et al. |
| 2010/0216388 A1 | 8/2010 | Tresh et al. |
| 2010/0223085 A1 | 9/2010 | Gauthier et al. |
| 2010/0223800 A1 | 9/2010 | Morrison et al. |
| 2010/0245083 A1 | 9/2010 | Lewis |
| 2010/0248609 A1 | 9/2010 | Tresh et al. |
| 2010/0267325 A1 | 10/2010 | Matser et al. |
| 2010/0304657 A1 | 12/2010 | Gallmann et al. |
| 2010/0314849 A1 | 12/2010 | Realegeno-Amaya |
| 2010/0328889 A1 | 12/2010 | Campbell et al. |
| 2011/0009047 A1 | 1/2011 | Noteboom et al. |
| 2011/0014862 A1 | 1/2011 | Honold et al. |
| 2011/0031071 A1 | 2/2011 | Takeuchi |
| 2011/0078480 A1 | 3/2011 | Calo et al. |
| 2011/0094978 A1 | 4/2011 | Bailey et al. |
| 2011/0105010 A1 | 5/2011 | Day |
| 2011/0122570 A1 | 5/2011 | Beck et al. |
| 2011/0143644 A1 | 6/2011 | McMahan et al. |
| 2011/0156480 A1 | 6/2011 | Park |
| 2011/0157829 A1 | 6/2011 | Wormsbecher et al. |
| 2011/0189936 A1 | 8/2011 | Haspers et al. |
| 2011/0195652 A1 | 8/2011 | Smith |
| 2011/0217916 A1 | 9/2011 | De Zen |
| 2011/0232209 A1 | 9/2011 | Boersema |
| 2011/0239679 A1 | 10/2011 | Dechene et al. |
| 2011/0239681 A1 | 10/2011 | Ziegler |
| 2011/0239683 A1 | 10/2011 | Czamara et al. |
| 2011/0306288 A1 | 12/2011 | Murayama |
| 2012/0012283 A1 | 1/2012 | Bean, Jr. |
| 2012/0014060 A1 | 1/2012 | Slessman |
| 2012/0014061 A1 | 1/2012 | Slessman |
| 2012/0018966 A1 | 1/2012 | Moore et al. |
| 2012/0031585 A1 | 2/2012 | Salpeter |
| 2012/0041569 A1 | 2/2012 | Zhang |
| 2012/0147552 A1 | 6/2012 | Driggers |
| 2012/0167600 A1 | 7/2012 | Dunnavant |
| 2012/0229972 A1 | 9/2012 | Bean, Jr. |
| 2012/0255710 A1 | 10/2012 | Maselli |
| 2012/0276834 A1 | 11/2012 | Peng et al. |
| 2012/0281357 A1 | 11/2012 | Peng et al. |
| 2012/0297807 A1 | 11/2012 | Canney et al. |
| 2012/0300391 A1 | 11/2012 | Keisling |
| 2012/0300398 A1 | 11/2012 | Eckberg et al. |
| 2012/0327592 A1 | 12/2012 | Godrich et al. |
| 2012/0331317 A1 | 12/2012 | Rogers |
| 2013/1478291 | 6/2013 | Slessman |
| 2013/0242504 A1 | 9/2013 | Cartes et al. |
| 2013/0267161 A1 | 10/2013 | Iqbal |
| 2013/0340361 A1 | 12/2013 | Rogers |
| 2014/0137491 A1 | 5/2014 | Somani et al. |
| 2015/0017904 A1 | 1/2015 | Liang |
| 2015/0181750 A1 | 6/2015 | Bailey |
| 2016/0215999 A1 | 7/2016 | Bard |

OTHER PUBLICATIONS

Intel, publication date, if any, unknown, "Air-Cooled High-Performance Data Centers: Case Studies and Best Methods", white paper, dated Nov. 2006, pp. 1-20.

Complaint, "*Switch v. Aligned Data Centers*", 2017, U.S District Court for the Eastern District of Texas, Marshall Division (Civil Action No. 2:17-CV-574-JRG). Litigation concerning U.S. Pat. No. 9,622,389 with invalidity allegation based on U.S. Pat. No. 8,636,565 (US2008/0055850).

Proffitt, M. "Rack-Level Power and Cooling Designs: Staying Ahead of the Curve", Jan. 2003, *ECN Magazine* p. 33.

Beaty, D. "Cooling Data Centers with Raised-Floor Plenums", Sep. 2005, *HPAC Engineering* pp. 58-65.

Fink, J. "Impact of High Density Hot Aisles on IT Personnel Work Conditions", 2005, *APC White Paper #123* pp. 1-15.

Dunlap, K. "Maximizing Data Center Cooling—Auditing and understanding data center cooling performance", Jan. 2005, *Energy User News* pp. 10, 12.

Dunlap et al., The Advantages of Row and Rack-Oriented Cooling Architectures for Data Centers, 2006, *APC White Paper #130* pp. 1-21.

Greenberg et al., "Best Practices for Data Centers: Lessons Learned from Benchmarking 22 Data Centers", 2006, *ACEEE Summer Study on Energy Efficiency in Buildings* pp. 376-387.

Rasmussen, N. "Cooling Strategies for Ultra-High Density Racks and Blade Servers", 2006, *APC White Paper #46 (Revision 5)* pp. 1-22.

Hannaford, P. "Ten Cooling Solutions to Support High-Density Server Deployment", 2006, *APC White Paper #42 (Revision 2)* pp. 1-16.

Domich, K. "Data-center power and cooling strategies", May 2007, Infostor pp. 32-33.

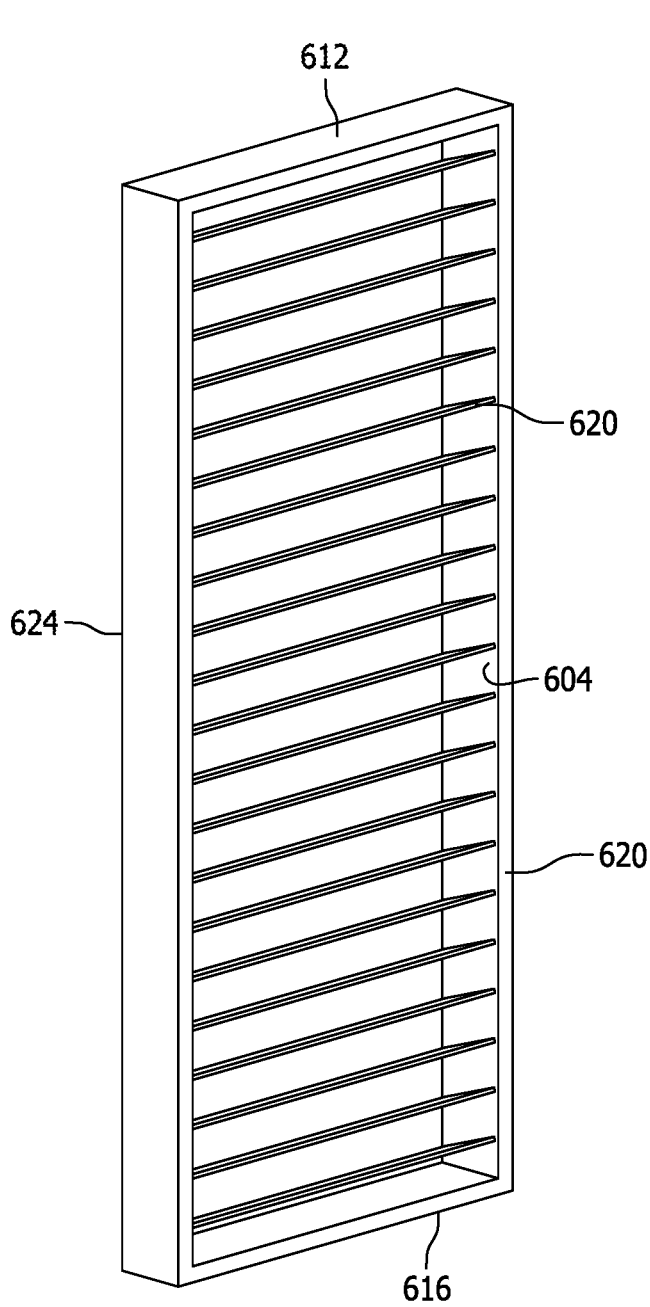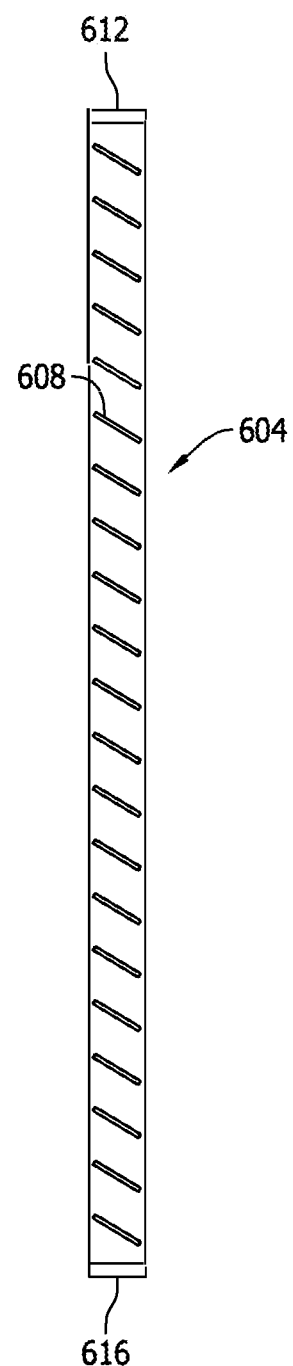
FIG. 6A
FIG. 6B

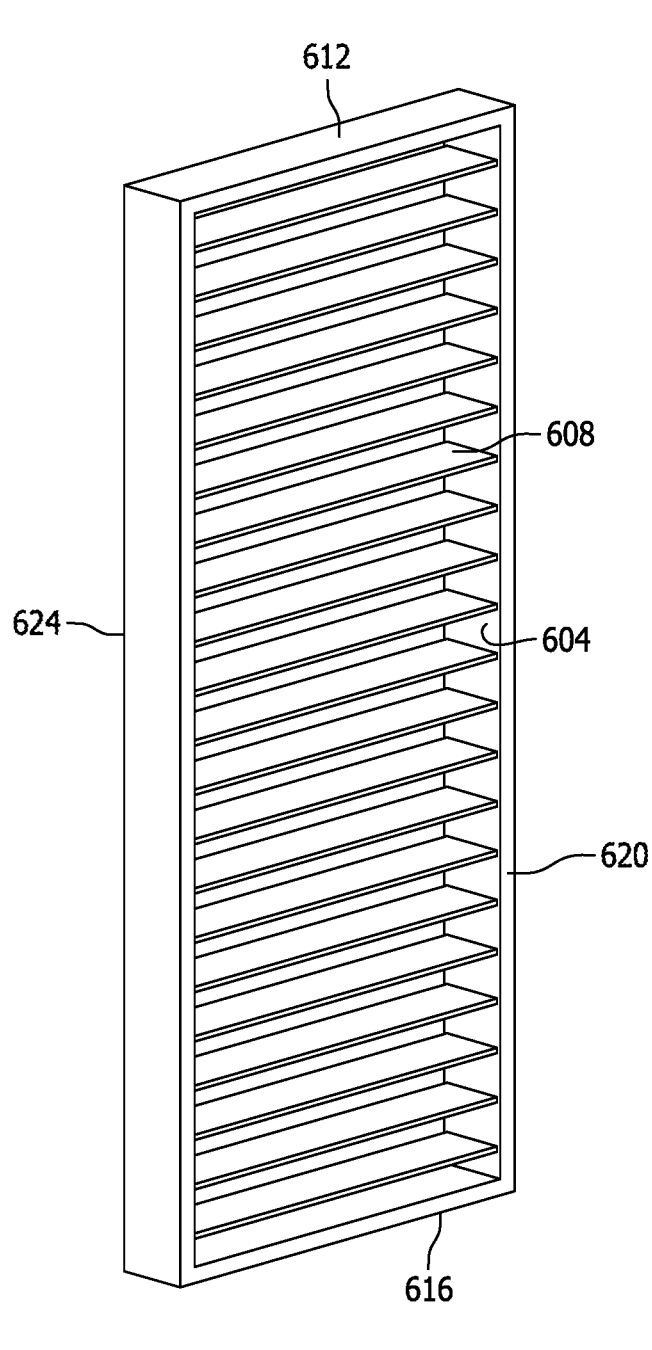
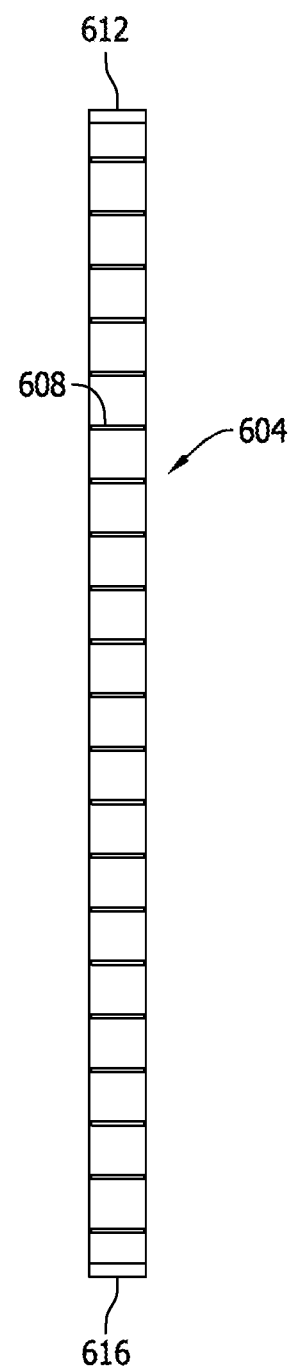
FIG. 7A
FIG. 7B

VENTILATION AND AIR FLOW CONTROL WITH HEAT INSULATED COMPARTMENT

FIELD OF THE INVENTION

This invention relates to cooling and heating systems and in particular to a system for air flow control and heat separation in electrical equipment locations, such as co-location facility designs.

RELATED ART

Numerous applications benefit from or require air flow and heat separation to provide cool, fresh and/or non-contaminated airflow, or airflow for heating, cooling, humidity control or drying. One example environment that requires airflow is electrical equipment, such as equipment located in data centers and server co-location facilities.

In such facilities, rows of electronics equipment, such as servers, power supplies, switchgear, and network communication devices are stored and interconnected or connected to a network, such as the Internet or direct network connections to remote systems. In many facilities and applications, cabinets are arranged side by side and each cabinet may house multiple server cards, communication cards, electrical disconnect switches, fuses, circuit breakers, or power supplies. As is widely understood, electrical equipment generates heat and this heat must be removed from the electrical equipment to ensure that the electrical equipment is maintained within manufacturer's specified temperature range. Additionally, certain switchgear equipment, including electrical disconnect switches, fuses, circuit breakers, etc. may be more sensitive to higher temperatures and pressures and would thus benefit from being physically separated from other heat generating electronic equipment to prevent damage to and/or failure of the sensitive equipment.

In some instances, the electrical equipment is separately owned such that the owner of the electrical equipment may have its own temperature range for operation or other operating parameters which must be met. In addition, the activity level of the servers may change based on the nature of the server itself. For example, some servers may be most active during work hours, while other servers may be primarily active on the weekends and holidays. This will thus affect the time at which heat is generated. In many instances, the owner of the facilities manages the installation and the servers within the facility, and is responsible for maintaining the servers and the server environment.

As mentioned above, electrical equipment generates heat during operation and the amount of heat generated will vary over time, typically in relation to the activity level of the electronic equipment. To maintain the equipment within a defined safe operating range, cooling air flow is typically used to conduct the heat away from the equipment. Failure to maintain the electrical equipment within a defined safe operating temperate range will result in equipment shut down or equipment failure.

Prior innovations by Switch, Ltd. have advanced the efficiency and technology of data centers. Switch, Ltd invented and introduced to the industry cabinets of electronic equipment placed into rows, and further to have parallel rows of equipment configured back-to back so that each row of equipment generally forces the heat from a front of the cabinet, over the electronic equipment toward a common area behind the cabinets. This common area, as introduced by Switch, Ltd., is now referred to in the industry as an enclosed hot aisle, as that aisle generally contains air warmed from passing through the cabinets containing the electrical equipment. Consequently, the area in front of the equipment is often referred to as a cold aisle. In addition, systems that sense the temperatures, pressures, and humidity in the hot aisle and the cold aisle and provide a feedback are provided. Based on this feedback, additional cooling may automatically be provided to the cool aisle if the cool aisle exceeds a predetermined temperature. Likewise, servers and power supplies are known to have built in temperature sensors to provide an alert or a shutdown signal if the server/power supply temperature exceeds a predetermined safe threshold.

However, improvements in the overall control would be beneficial to numerous aspect of data center operation, particularly for data centers that utilize Switch, Ltd., improvements or in other data center designs to control and promote efficient air flow.

SUMMARY

To overcome the drawbacks of the prior art, disclosed is an electrical cabinet with associated air flow direction and heat separation control systems. In one embodiment the cabinet has a front side, a rear side, a top side, a floor side, a first side and a second side. The front side has one or more openings to accept flow of cool air into the cabinet and the rear side has one or more openings for exit of warm air from the rear side of the cabinet. The front side, rear side, top side, floor side, first side and second side define an interior space configured to house heat generating electrical equipment and heat sensitive switchgear within the housing. A thermal barrier is located within the cabinet substantially parallel to the top side and floor side. The thermal barrier divides the interior space of the cabinet into lower and upper compartments allowing the heat generating electrical equipment and heat sensitive equipment to occupy separate spaces maintained at different temperatures and pressures within the housing. The thermal barrier may be comprised of one or more panels having one or more layers of insulating material. In one embodiment, the thermal barrier further includes one or more fans configured to conduct flow away from the compartment housing the heat sensitive equipment. The one or more fans may be controlled by a fan control system that reads temperature signals from temperature sensors located within the compartments and then calculates and adjusts the fan speed(s) to increase or decrease the rate of flow of exhaust air from the first compartment 1581 interior space out of the first compartment 1581 rear side. In one embodiment heat generating electrical equipment such as servers are housed within the lower compartment while heat sensitive equipment such as switchgear is housed within the upper compartment. In an alternative embodiment the heat generating electrical equipment is housed within the upper compartment while the heat sensitive equipment is housed within the lower compartment. The compartment housing the heat sensitive equipment further includes a thermal seal at its rear side that is selectively openable/closeable to further prevent warm air from entering the compartment housing the heat sensitive equipment. In one embodiment the thermal seal comprises a door panel having one or more layers of insulating material. A frame is adjacent the rear side of the cabinet and the frame has a first frame side and a second frame side. Two or more louvers are adjacent the rear side of the cabinet and extend between the first frame side and the second frame side. In this example embodiment, at least one louver has at least one face positioned at an angle to direct the warm air exiting the cabinets in a direction other than perpendicular to the rear side of the cabinet.

This embodiment may further include two or more legs connected to the frame such that the two or more legs cooperate with the frame to adjust a height of the frame in relation to a floor. The frame may be releasably connected to the cabinet adjacent the rear side of the cabinet. In addition, the two or more louvers may be fixed to the frame thereby fixing the angle associated with the louver. Alternatively, the two or more louvers may be movable in relation to the frame from a first position to a second position such that the first position establishes a first louver angle and the second position establishes a second louver angle. Although described in relation to a first position and a second position, the louvers may be set at any position, either manually or automatically, either in steps, or through any other movement control. The louvers may be opened or completely closed, or moved to any position between open and closed. In one embodiment, a stepper motor is used. The louvers may be moved by actuators, either manual, mechanical, or automated, or any other movement control devices. The louver position control devices may receive signal, such as an electrical or wireless signal, from a data center management system which monitors and controls the entire data center including overall and specific location temperature control, power usage, and airflow control. The data center management system includes one or more computers which receive sensor data and process the sensor data to generate automated or manually generated control signals that can control the position of the louvers. It is also contemplated that the louver position control devices may receive control signals directly from air flow or temperature sensors located near the louvers for automated control or as a back-up control method.

The frame may include at least one motor associated with at least one frame such that the at least one motor is responsive to a control signal to change the angle of at least one louver. In one configuration, a first group of the two or more louvers are positioned at a first angle and a second group of two or more louvers are position at a second angle.

Also disclosed is an arrangement of cabinets with associated air flow direction control system. This embodiment includes a first row of cabinets comprising three or more cabinets and a second row of cabinets comprising three or more cabinets. The cabinets in the first row of cabinets and the second row of cabinets have a front side, a rear side, a top side, a floor side, a first side, a second side, and a thermal barrier separating the interior space of the cabinet into upper and lower compartments. The front side has one or more front openings to accept flow of cool air into the cabinet and the rear side has one or more rear openings for exit of warm air from the rear side of the cabinet. A portion of the rear side has a selectively openable/closeable thermal seal to ensure that warm air does not enter the compartment used for housing heat sensitive equipment. The front side, rear side, top side, bottom side/floor side, first side and second side define an interior space divided into upper and lower compartments by a thermal barrier and configured to house heat generating electrical equipment and heat sensitive equipment in separate compartments within the housing, such that the rear side of the first row of cabinets faces the rear side of the second row of cabinets thereby establishing a hot aisle between the first row of cabinets, second row of cabinets, a floor, and a ceiling. The thermal seal at the rear side of the cabinets prevents warm air within the hot aisle from entering the compartment used for housing heat sensitive equipment. Also part of this embodiment is a first set of louvers supported by a first frame adjacent the rear side of each cabinet of the first row of cabinets. The first set of louvers extend at least across a portion of the rear side of each of the cabinets that form the first row of cabinets. A second set of louvers are supported by a second frame adjacent the rear side of each cabinet of the second row of cabinets. The second set of louvers extend at least across a portion of the rear side of each of the cabinets that form the first row of cabinets.

In one embodiment, the first set of louvers and the second set of louvers are positioned at an angle to direct the warm air exiting the cabinets upward to the ceiling and the ceiling is configured to vent the warm air in the hot aisle from the hot aisle. In an embodiment where heat sensitive equipment is stored within the lower compartment of the cabinet, the louvers further serve to direct warm air away from the heat sensitive equipment. The first set of louvers may be adjustable between a first position, a second position and a third position such that the first position directs warm airflow upward, the second position directs warm air flow perpendicular to the rear face of the cabinets and the third position inhibits airflow from the one or more rear openings. Although discussed as a first, second, and third position, it is understood that the louvers may be adjusted to any position. The arrangement of cabinets may further include two or more legs associated with the frame such that the two or more legs are adjustable to change a height of the louvers relative to the floor. It is further contemplated that at least one motor may be associated with at least one louver. The motor being responsive to a motor control signal to change the angle of the at least one louver.

It is also contemplated that a first group of the first set of louvers are positioned at a first angle and a second group of the second set of louvers are positioned at a second angle. In one embodiment the arrangement of cabinets also includes one or more temperature sensors, one or more air flow sensors, one or more pressure sensors, one or more humidity sensors, or one or more of each configured to generate sensor signals, and a controller configured to receive and process sensor signals. Responsive to the processing of the sensor signals, the controller generates the motor control signals which control the position of at least one louver and may also control fans located in or as part of the louver.

Also disclosed are apparatus and methods for maintaining temperature, within a predetermined range, within a cabinet storing electrical equipment. In one embodiment this method comprises providing a first row of cabinets and providing a second row of cabinets. The cabinets in the first row of cabinets and the second row of cabinets having a front side and a rear side. The front side has one or more front openings to accept flow of cool air into the cabinet and the rear side has one or more rear openings for exit of warm air from the rear side of the cabinet. The front side and rear side define an interior space separated into upper and lower compartments by a thermal barrier and is configured to house heat generating electrical equipment and heat sensitive equipment within separate compartments of the interior space. The rear side of the first row of cabinets faces the rear side of the second row of cabinets thereby establishing a hot aisle between the first row of cabinets, second row of cabinets, a floor, and a ceiling.

This method also includes adjusting a first set of louvers to direct airflow exiting the rear side of the cabinet in a direction non-perpendicular to the rear side of the first row of cabinet. The rear side of one of the compartments is provided with a thermal seal to prevent warm air from entering the compartment. The first set of louvers is supported by a first frame which is adjacent the rear side of each of the cabinets of the first row of cabinets and the first set of louvers extend at least across at least a portion of the rear side of each of the cabinets that form the first row of cabinets. Adjusting a second set of louvers directs airflow exiting the rear side of the cabinet in a direction non-perpendicular to the rear side of the second row of cabinet. The second set of louvers is supported by a second frame which is adjacent the rear side of each of the cabinets of the second row of cabinets and the second set of louvers extend across at least a portion of the rear side of each of the cabinets that form the second row of cabinets.

To maintain temperature, cooling airflow is presented to the front of the first row and second row of cabinets. The cooling airflow flows from the front of the cabinets toward the rear of the cabinets resulting in the cooling airflow becoming warm airflow due to heat generated and emitted by heat generating electrical equipment placed within the cabinets. After exiting the cabinet or when exiting the cabinet, the warm airflow is directed by the louvers of the first row of cabinets and the second row of cabinets toward one or more warm air vents associated with the hot aisle. In one embodiment the warm air vents are on or in the ceiling. The louvers may direct the air flow in the same direction or different directions based on the location of the warm air vents. In one embodiment the louvers direct the air flow away from a thermal seal at the rear side of the cabinet. In one embodiment, the warm air from the first row of cabinets is directed by the louvers in a first direction and the warm air from the second row of cabinets is directed by the louvers in a second direction. In one configuration, the first direction and the second direction are not opposing directions. In one configuration, the first direction and the second direction are toward the warm air vent in the hot aisle. The hot air may be vented to the exterior of a building, into a separate room of the building, into an above ceiling plenum or below floor plenum of the building, used for building heating, or this method of operation may cool the warm airflow entering the one or more warm air vents to create cool airflow and then return the cool airflow to the front of the cabinets.

In one configuration, the rear side of the first row of cabinets faces the rear side of the second row of cabinets. The rear sides of the rows of cabinets may be subdivided into a first compartment rear side and a second compartment rear side. During operation, typically only the compartment housing the heat generating electrical equipment is open to the hot aisle between the rows of cabinets while the compartment housing heat sensitive equipment is enclosed at its rear side by a thermal seal. At least one louver may be adjustable by a motor and the motor responsive to a motor control signal from a controller. It is also contemplated that one or more temperature sensors, airflow sensors, pressure sensors, or some combination of each are provided and are configured to provide sensor signals to the controller and the motor control signal responsive to the sensor signal. In one embodiment, this method of operation also includes increasing air flow with one or more fans mounted to the thermal barrier and at least one louver such that adjusting a louver adjusts the one or more fans mounted to the adjusted louver. To change the height of the frames that hold the louvers, two or more legs may be height adjusted to change a height of the first set of louvers and the second set of louvers.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 6A illustrates a perspective view of louvers and frame.

FIG. 6B illustrates a side view of the louvers of FIG. 6A.

FIG. 7A illustrates a perspective view of louvers and frame.

FIG. 7B illustrates a side view of the louvers of FIG. 7A.

DETAILED DESCRIPTION

Figure 1A:
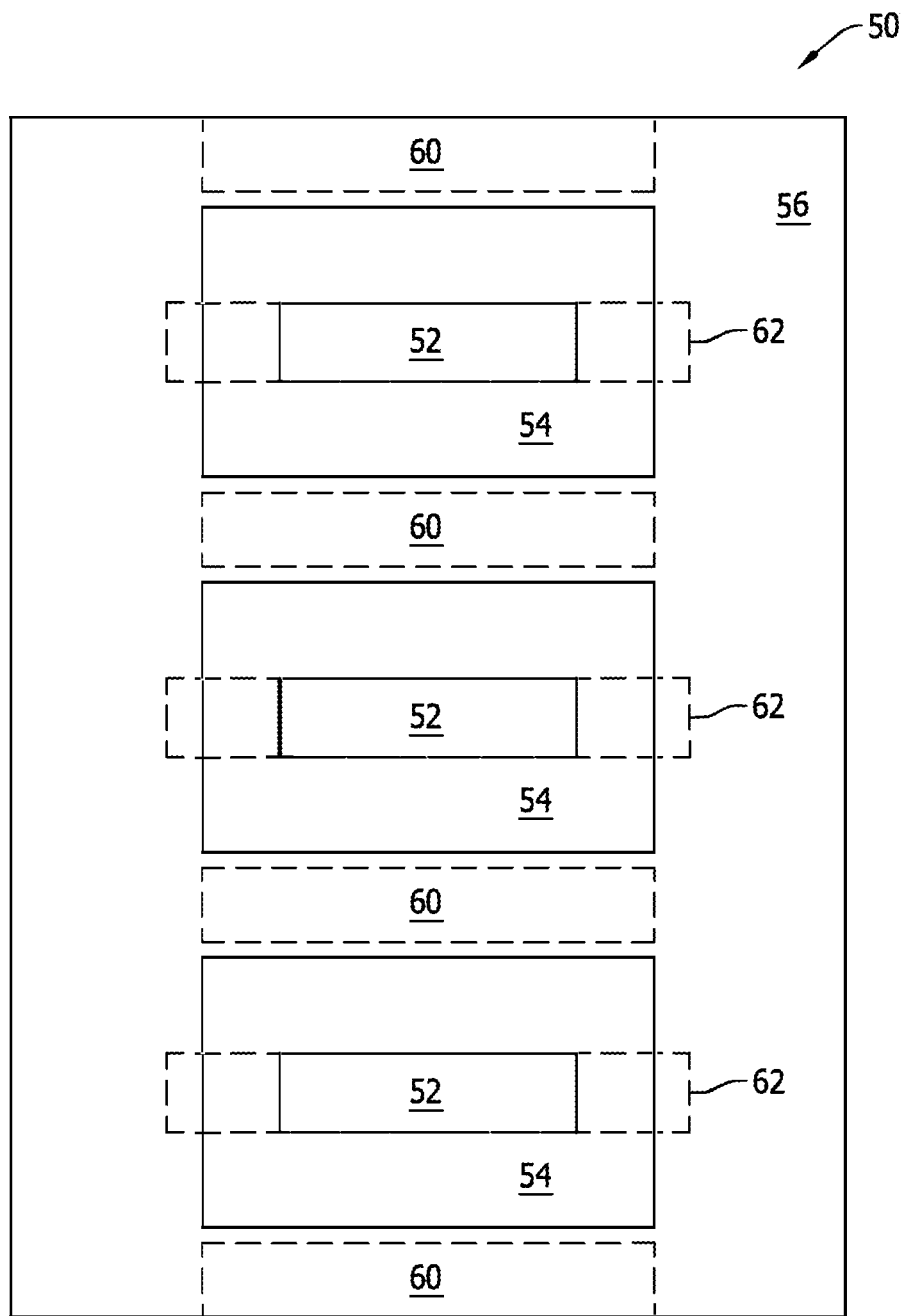
FIG. 1A illustrates a floor design used in an electrical equipment room, such as a data center or co-location facility according to the present invention.

FIG. 1A illustrates a floor design used in an electrical equipment room, such as for a data center or co-location facility, according to the present invention. The preferred embodiment discussed herein uses parallel rows of equipment configured back-to back so that each row of equipment generally forces the heat from the electronic equipment towards a hot aisle, thus also establishing a cold aisle in the front of the equipment. The cold aisles in FIG. 1A are illustrated at the dotted line block 60 and the hot aisles are illustrated at the dotted line block 62. One feature of the present invention is the provision for marking the floor 50 to explicitly show the various areas of the facility. As illustrated, the hot aisle 62 has a central area 52 that is tiled, painted, taped or otherwise marked to indicate that it is center area of the hot aisle 62, also referred to as a central hot air area. The typical dimensions of the central area 52 are typically in the range of 2'-4' across the width, with a row length corresponding to the number of electronic cabinets in the row. Marking with tiles is preferable as the marking will last, and tiles that are red in color, corresponding to the generation of heat, have been found preferable. Around this center area 52 is a perimeter area 54, over which the cabinets are installed. This perimeter area 54 is marked in another manner, such as using a grey tile that is different in color from the center area 52. Around the perimeter area 54 is an outside area 56, which is marked in yet a different manner, such as using a light grey tile. The placement of these markings for areas 52, 54 and 56 on the floor of the facility, preferably prior to moving any equipment onto the floor, allows for a visual correspondence on the floor of the various hot and cold aisles. In particular, when installing cabinets over the perimeter 54 are, the area that is for the front of the cabinet that will face the cold aisle, and thus the area for the back of the cabinet for the hot aisle, is readily apparent.

Figure 1B:
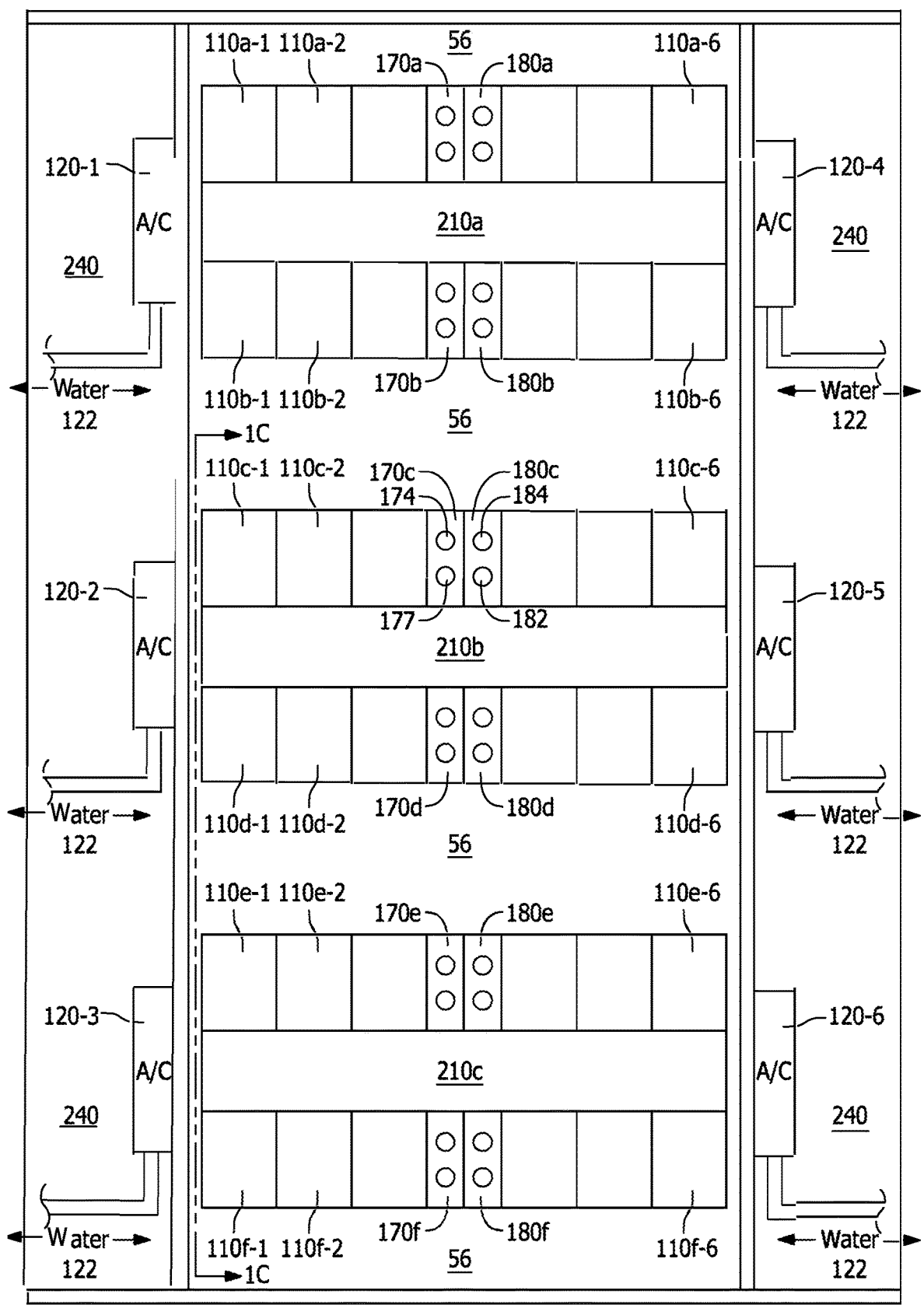
FIG. 1B illustrates floor-based components disposed over the floor design of the electrical equipment room, such as a co-location facility, according to the present invention.

FIG. 1B illustrates floor-based components disposed over the floor design of the co-location facility according to the present invention. FIG. 1B also shows additional area of the floor, which in this embodiment is provided to illustrate interaction of the electronics equipment with the evaporators of the air conditioning units. In the embodiment described with respect to FIG. 1B, certain features are included so that conventional equipment, particularly conventional air conditioning equipment, can effectively be used while still creating the desired air flow patterns of the present invention as described herein.

Before describing the components in FIG. 1B, an aspect of the present invention is to isolate the hot air exhaust from the areas that require cooling as much as possible, and to also create air flows in which the air moves through the exhaust system, into the air conditioning system, through the air conditioning ducts and out to the cool equipment in a very rapid manner. In particular, the amount of circulation established according to the present invention moves air at a volume such that the entire volume of air in the facility recirculates rapidly. In one embodiment recirculation occurs at least once every 10 minutes, preferably once every 5 minutes, and for maximum cooling once every minute. It has been found that this amount of recirculation, in combination with the air flows established by the present invention, considerably reduce the temperature in the facility in an environmentally efficient manner.

Cabinets 110 shown in FIG. 1B are placed generally over the sides of the perimeter 54 as described, in rows. Different rows are thus shown with cabinets 110(a-f) with each letter indicating a different row. Also included within the rows are electrical equipment 170 to which the electronic equipment in each of the cabinets 110 connect as described further herein, as well as power equipment 180, containing circuit breakers as is known to protect against energy spikes and the like, that is used to supply power along wires to the electronics equipment in each of the cabinets 110 connect as described further herein. Air conditioning units 120 include the evaporator units 120 (1-6) that are shown being physically separated by some type of barrier from the area 56 described previously with respect to FIG. 1A. The condenser units of the air conditioning system that receive the warmed refrigerant/water along lines 122 and are disposed outside the walls of the facility are not shown. This physical separation is implemented in order to establish warm exhaust channel area 240 separate from the physical space, which warm air area, will connect to a separate warm air area in the ceiling and allow the warm air to flow into the exhaust channel area 240 and enter into intake ducts of evaporator air conditioning equipment 120, as will be described. This feature allows the usage of conventional evaporator air conditioning equipment that has air intakes at the bottom of the unit, as well as allows for usage of different air conditioning equipment types, while still maintaining an efficient airflow throughout the entire facility.

Figure 1C:
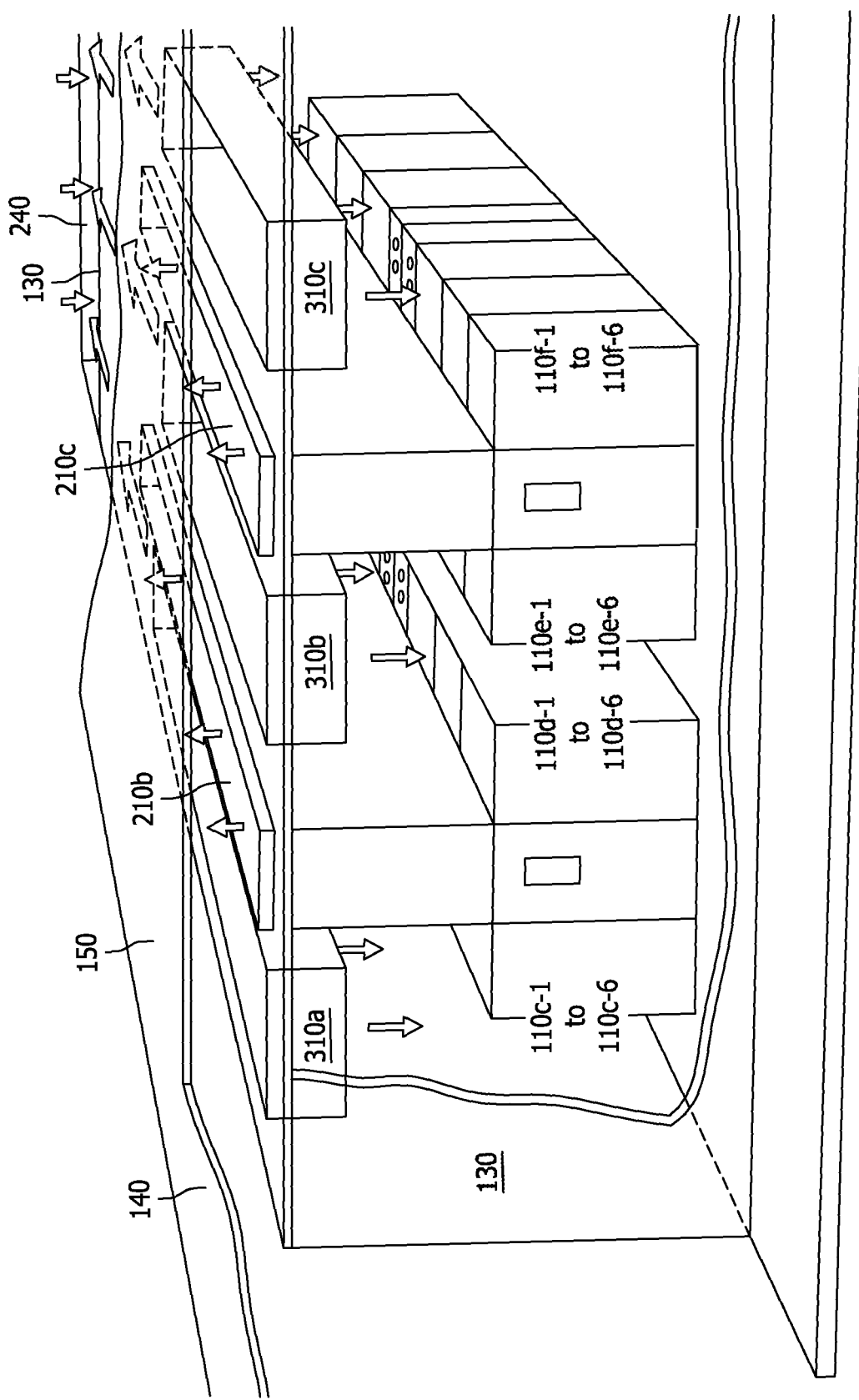
FIG. 1C illustrates a perspective cut-away view along line c-c from FIG. 1A.

FIG. 1C illustrates a perspective cut-away view along line c-c from FIG. 1A of the FIG. 1A. Additionally illustrated are the false ceiling 140 and the actual ceiling 150, which have a gap that is preferably at least 1.5-3 feet and advantageously at least 15 feet, as the higher the ceiling the more the warm air rises (and thus also stays further away from the equipment in the cabinets 110). The false ceiling 140 is preferably made of tiles that can be inserted into a suspended ceiling as is known, which tiles preferably have are drywall vinyl tiles, which exhibit a greater mass than many conventional tiles. Also shown are arrows that illustrate the air flow being centrally lifted upward from the hot air area containment chamber (hot aisle) 210 formed by the thermal shields 400 to the area between the false ceiling 140 and the actual ceiling 150, and the flow within the ceiling toward the warm exhaust channel area 240, and then downward into the warm exhaust channel area 240 with the wall 130 separating the area 56 and the warm exhaust channel area 240. Also shown are arrows that take cold air from the cold air ducts 310 and insert the air into the cold aisles 60.

Though the arrows in the drawing are directed straight downward, the vents themselves can be adjusted to force or direct for directional downward flow at various angles. In a preferred embodiment, each of the vents have a remote-controlled actuator that allows for the offsite control of the vents, both in terms of direction and volume of air let out of each vent. This allows precise control such that if a particular area is hot, more cold air can be directed thereto, and this can be detected (using detectors not shown), and then adjusted for offsite.

Figure 2:
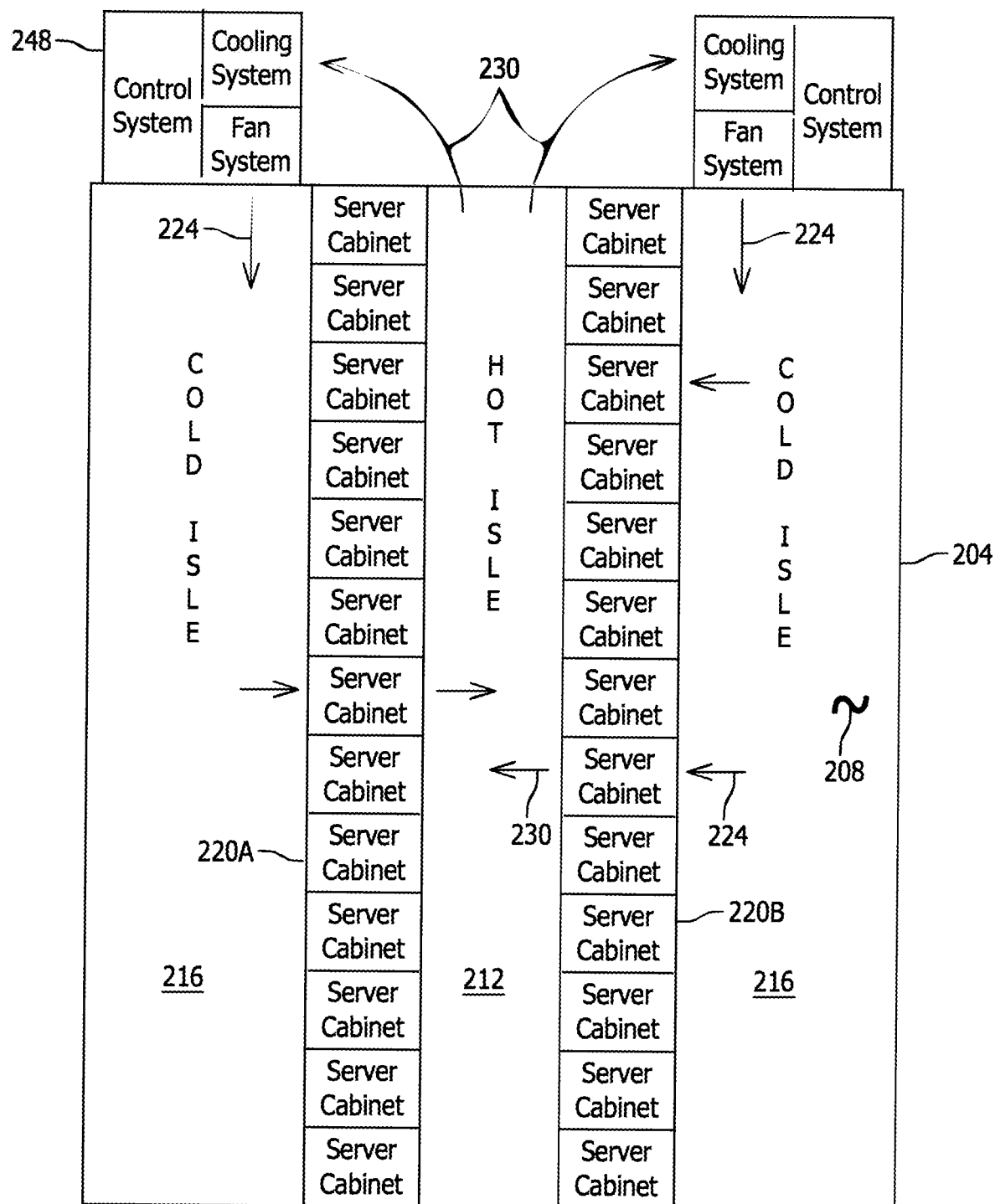
FIG. 2 illustrates a top plan view of an alternative embodiment of the location and cabinet layout in an electrical equipment room.

FIG. 2 illustrates a top plan view of an alternative embodiment of the room location and cabinet layout in an electrical equipment room. This is but one example embodiment and those of ordinary skill in the art will understand that other embodiment and layouts are possible without departing from the scope of the claims that follow.

As shown a building wall or containment wall 208 is shown which defines an inner space. Within the interior space are three main elements, normally one or more hot aisles 212, one or more cold aisles 216 and one or more rows of cabinets 220. The cabinets are configured to enclose and support electrical equipment, such as but not limited to servers, communication equipment, power supplies, control systems, routers, switches and switching equipment, memory, or any other electronic or electrical devices.

The cabinets are located between the hot aisles 212 and the cold aisles 216 such that air flow passes through the cabinets 220, such as from the front of the cabinet toward the back of the cabinet. The air flow includes cool air flow 224 which enters the cabinets 220 to cool the electrical equipment thereby conducting heat from the electrical equipment to form hot air flow 230 in the hot aisle. As shown, the rows of cabinets 220A, 220B placed back to back to separate the hot aisle 212 from the cold aisles 216. The front of the cabinet may be at a higher pressure than the back of the cabinet thereby causing airflow from cabinet front to cabinet back. One or more fans may be associated with the cabinets and/or the electrical equipment located in the cabinet to create air flow or increase air flow.

Also shown in FIG. 2 is a ventilation system that includes one or more fans 240 and a cooling system 244. The fans 240 move the air within the cold aisle 216 and/or the hot aisle 212. The cooling system 244 removes the heat from the hot air flow 230 entering from the hot aisle to create cold air flow 224 which is pushed back into the cold aisle 216. Air circulates in this manner thereby maintaining a desired operating temperature of the electrical equipment.

Figure 3:
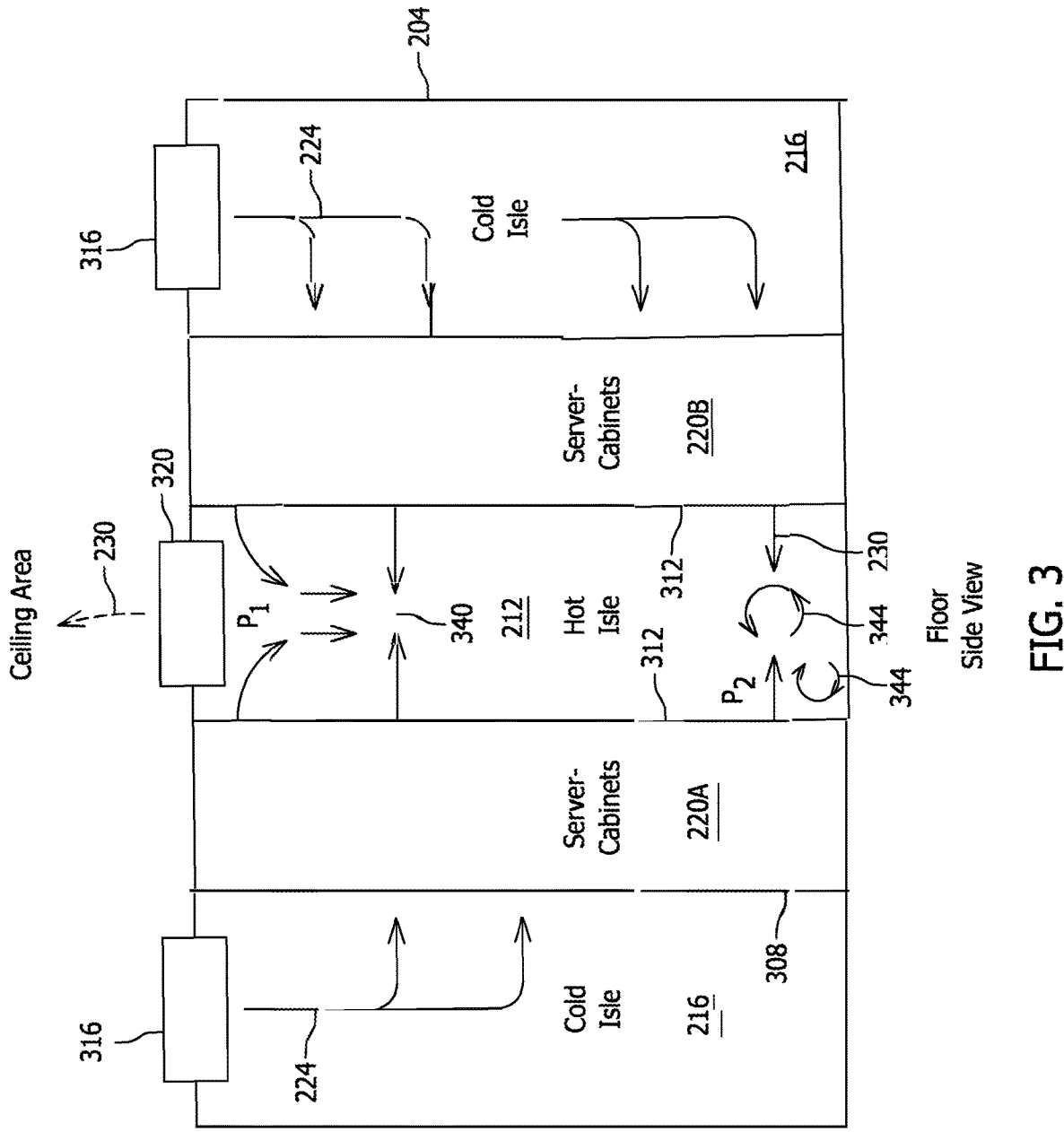
FIG. 3 illustrates a side plan view of the server and cabinet layout in an electrical equipment room of FIG. 2.

FIG. 3 illustrates a side plan view of the server and cabinet layout in an electrical equipment room of FIG. 2. As compared to FIG. 2, identical elements are labeled with identical reference numbers. As shown in the side view of FIG. 3 a hot aisle 212 is between rows of cabinets 220A, 220B. Between the cabinets is a hot aisle 212. In this embodiment, the front of the cabinets 220 faces the cold aisle 216 while the back of the cabinets 312 are in the hot aisle 212.

In operation, as cold air flow 224 is blown into the cold aisle 216 through one or more vents 316, it passes through the cabinets 220A, 220B into the hot aisle 212. As a drawback to the prior art, because the cabinets 220A, 220B have backs 312 which are facing each other, the hot air exiting the back 312 of cabinets 220A is directed into the hot air exiting the back 312 of cabinet 220B. Thus, two opposing flows 340 of hot air are created in the hot aisle 212. This generates circular air flow patterns, referred to herein as eddies 340 and dead spots 344. The opposing air flow 340 and eddies 344 inhibits and prevents all of the hot air 230 from exiting the hot aisle 212 through the vent 320.

As can be appreciated, the opposing air flow 340 and eddies 344 create hots spots within the hot aisle and also inhibit the free flow of air in the hot aisle. In some instances, the opposing air flow 340 in the upper areas of the hot aisle creates an air curtain which inhibits air flow from the hot aisle 212 and within the cold aisle 216. In some instances, the hot aisle 212 is at a higher pressure than the cold aisle 216 which in turn inhibits air flow. This is a significant disadvantage for cooling efficacy. In other situations, the air flow through the cabinets may be too fast or faster than needed to maintain a desired cabinet temperature. This wastes energy by dumping cool air into the hot aisle, while at the same time denying that cool air to other cabinets in need of cooling. As such, the vents may be adjusted to reduce air flow through a cabinet, thereby causing additional airflow through other cabinets and reducing cooling costs. In yet other situations, the air flow through cabinets may be occurring when the cabinet is not populated with electrical equipment. In such a situation, the lack of equipment may create a low pressure air flow path that flows high volumes of air through a cabinet with no or minimal electrical equipment. Thus cooling is not needed in the cabinet that is only sparsely populated with heat generating electrical equipment. In addition, some cabinets may require more cooling due to the heat generating nature of the equipment in the cabinet or the preferred operating temperatures of the equipment in the cabinet.

Figure 4:
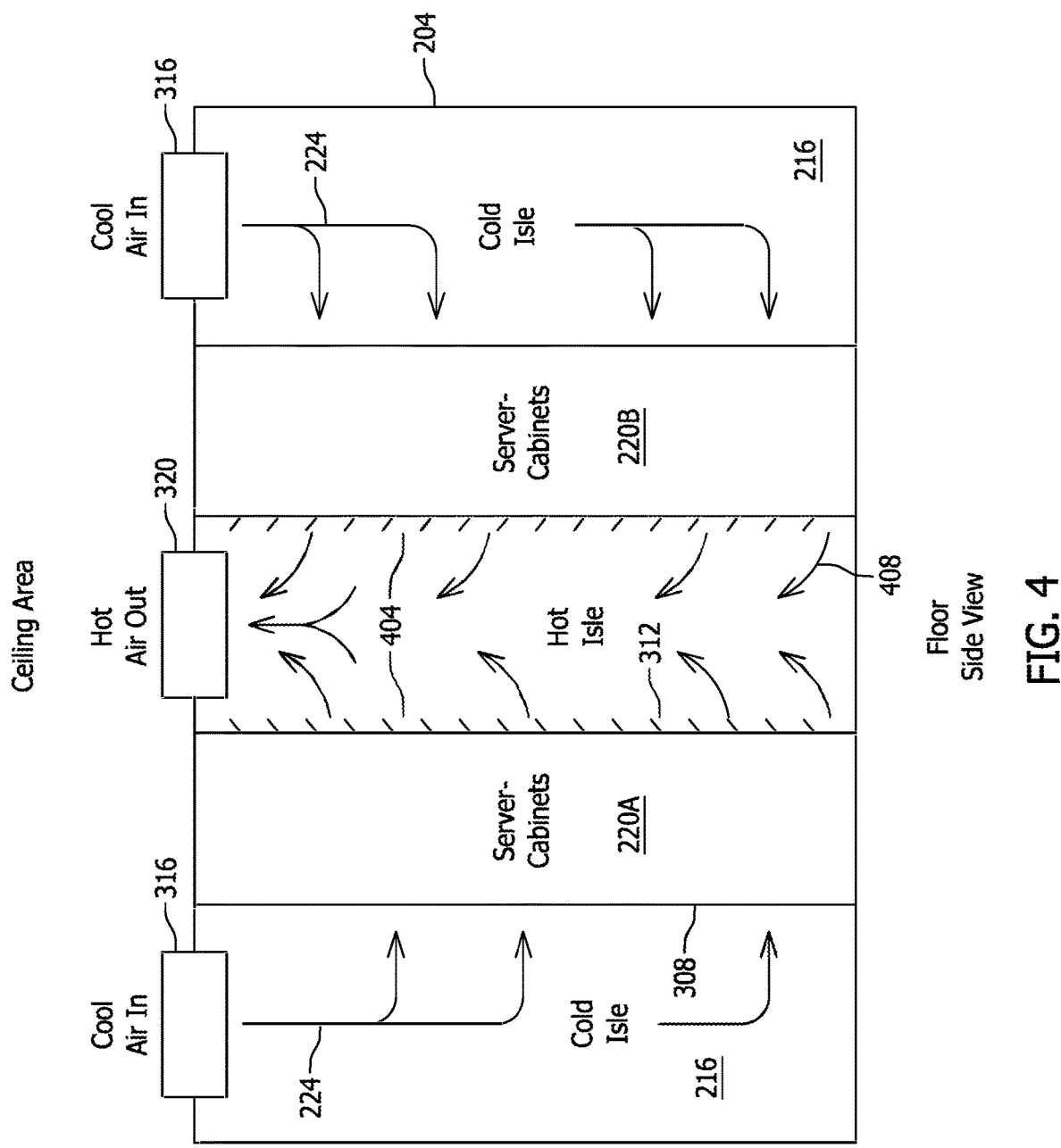
FIG. 4 illustrates an improved cabinet layout.

FIG. 4 illustrates an improved cabinet layout. As compared to FIGS. 2 and 3, identical elements are labeled with identical reference numbers. In FIG. 4, the back 312 of the cabinets 220A, 220B are fitted with louvers 404 which may be adjusted to direct air flow in a desired direction, or reduce air flow. As a result, the upward air flow 408 does not flow in opposing direction creating eddies or dead spots but instead is directed in the direction of the hot air vent 320. This improved cooling, provides even and uniform cooling across all parts of the back of the cabinets, and provides control of cooling based on factors such as cabinet usage.

Figure 5:
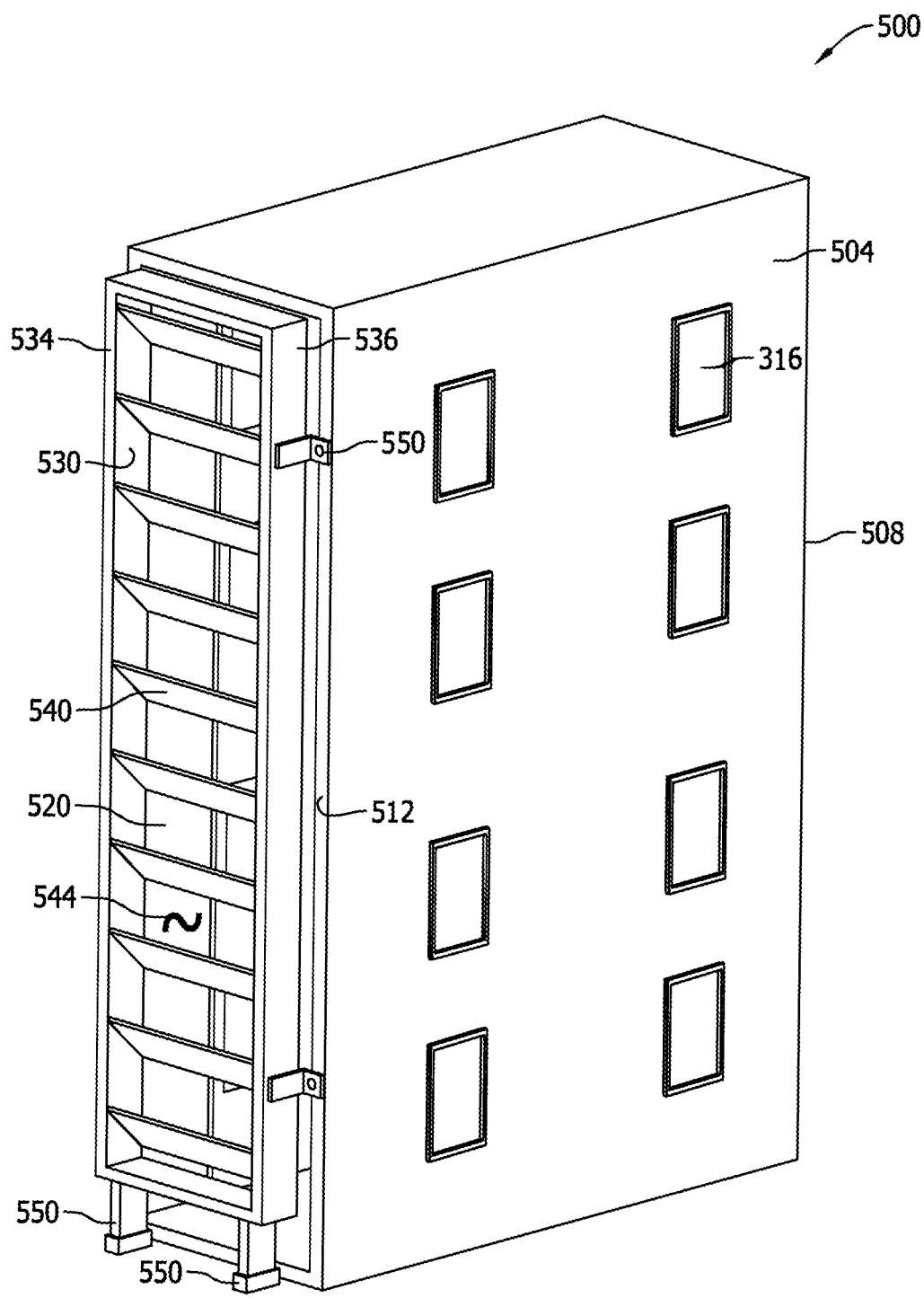
FIG. 5 illustrates an exemplary cabinet with back mounted louvers.

FIG. 5 illustrates an exemplary cabinet with back mounted louvers. This is but one possible embodiment and as such it is contemplated that one of ordinary skill in the art will arrive at different embodiments which do not depart from the claims that follow. In this embodiment a cabinet 500 is shown with two opposing side panels 504 and a top and bottom. The top and bottom may be formed by the same material as the sides or formed by a ceiling and floor respectively. The cabinet has a front side 508 and a rear or back side 512. The sides 504, top, and bottom define an interior. The interior is configured to house electrical equipment and may include brackets 520 or mounting points on the interior of the cabinet 500 to support and secure the electrical equipment. The sides 504 of the cabinets 500 may have openings to allow for wires, pipes, conduits or other elements to access the interior of the cabinet.

Mounted at the back of the cabinets 500 is a frame 530 having a first side 534 and a second side 536. The frame 530 may optionally include a top frame portion and bottom frame portion. Mounted between the first side 534 and the second side 536 are louvers 540 that are angled upward to direct the air flow from the rear of the cabinets upward. Between each louver 540 is an open space 544 which allows for the passage of air. The louvers 540 may be at any angle. As discussed below in greater detail, the louvers may be fixed in position, as shown in FIG. 5, or movable to thereby adjust the direction of the air flow and the size of the openings 544. If adjustable, the louvers may pivot about a central pin (not shown) or axis, in an arced recess, or in any other way now known in the art or develop in the future.

At the bottom of the frame 530 are legs 550 that support the frame on a floor. The legs may be of fixed length, or adjustable in height to move the frame 530 and associated louvers 540 upward or downward to align with the cabinet. Although not shown in this embodiment, it is contemplated that the frame may also have rails as part of the frame that expand the height of the frame. This may be useful if the cabinet height changes or if different height cabinets are in use or to expand the frame and louver dimensions to cover the full height or width of the back side of the cabinet, other structure or any opening. The legs or frame may mount to the floor to provide a more secure attachment.

One or more brackets 560 may be attached to or be integral with the frame 530 to attach the frame (and louvers) to the back of the cabinet 504. Bolts, screws, magnetics, slots, clips, or any other fastener may be used to secure the frame 530 to the cabinet 500. It is also contemplated that hinges may be used to connect the frame(s) (and louvers) to the cabinets. Hinges allow the frame to swing out of the way for access to the back of the cabinet.

In operation, the air exiting the back of the cabinet 500 hits the louvers and is directed upward (or in any direction based on the louvers). When arranged as rows of cabinets as shown in FIG. 5, the louvers angle upward eliminate the air flow from the back to back cabinets being opposing and thereby preventing dead spots and eddies. This in turn increases cooling efficiency and effectiveness.

FIG. 6A illustrates a perspective view of louvers and frame. FIG. 6B illustrates a side view of the louvers. FIGS. 6A and 6B are discussed together. FIGS. 6A and 6B illustrate a frame 604 around louvers 608. The frame 604 may include a top 612, bottom 616 and a first and second sides 620, 624.

In this embodiment, the louvers 608 are fixed at an upward angle. In this embodiment and all embodiments described herein the louvers may any size or shape. In this embodiment, the louvers 608 are straight but in other embodiment the louvers may have another shape such as but not limited to curved, angled, or oval, or any other shape or pattern.

FIG. 7A illustrates a perspective view of louvers and frame. FIG. 7B illustrates a side view of the louvers. FIGS. 7A and 7B are discussed together. Identical or similar items are labeled with identical reference numbers. It is contemplated that the louvers may be adjustable. As shown the louvers 608 are adjusted to a horizontal position within the frame 604. This arrangement provides for maximum air flow, but the air flow is directed directly out the back of the cabinet.

Figure 8A:
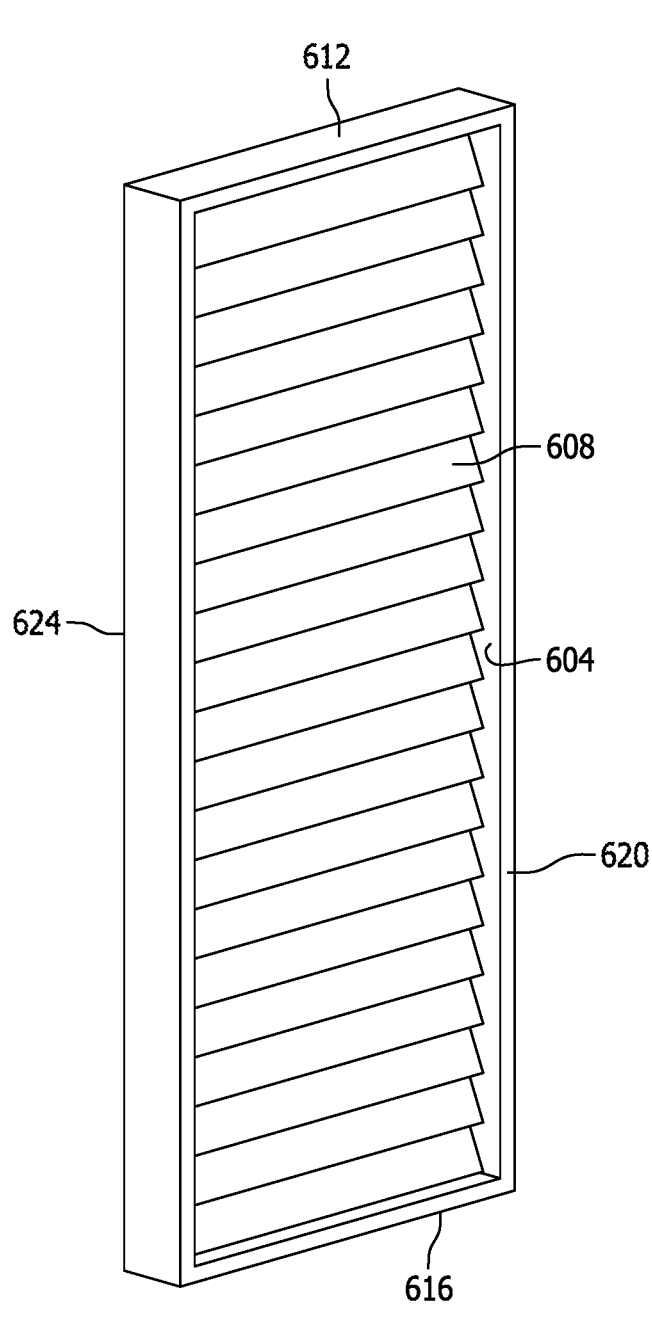
FIG. 8A illustrates a perspective view of louvers and frame.
Figure 8B:
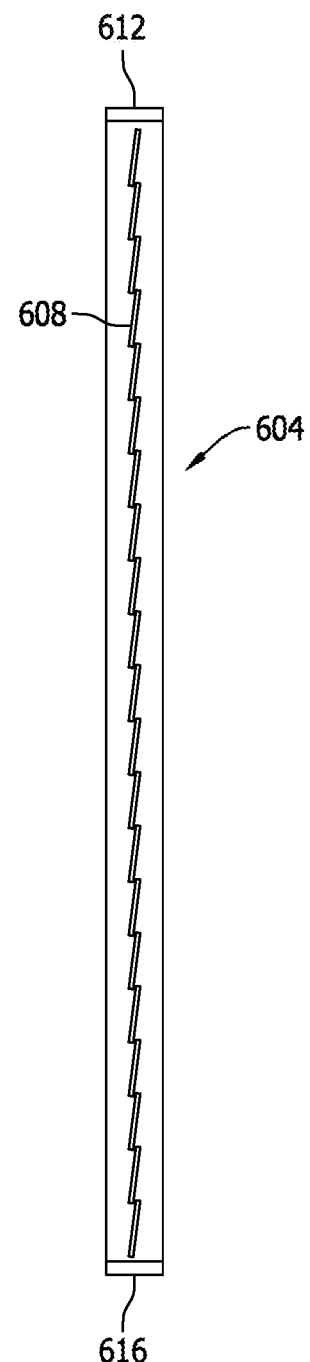
FIG. 8B illustrates a side view of the louvers of FIG. 8A.

FIG. 8A illustrates a perspective view of louvers and frame. FIG. 8B illustrates a side view of the louvers. FIGS. 8A and 8B are discussed together. Identical or similar items are labeled with identical reference numbers. It is contemplated that the louvers may be adjustable. As shown the louvers 608 are adjusted to a generally vertical position within the frame 604 to block or inhibit air flow. This arrangement provides for minimal air flow. In relation to FIGS. 6A, 7A and 8A, the louvers 608 may be set at any angle.

Figures 9A, 9B:
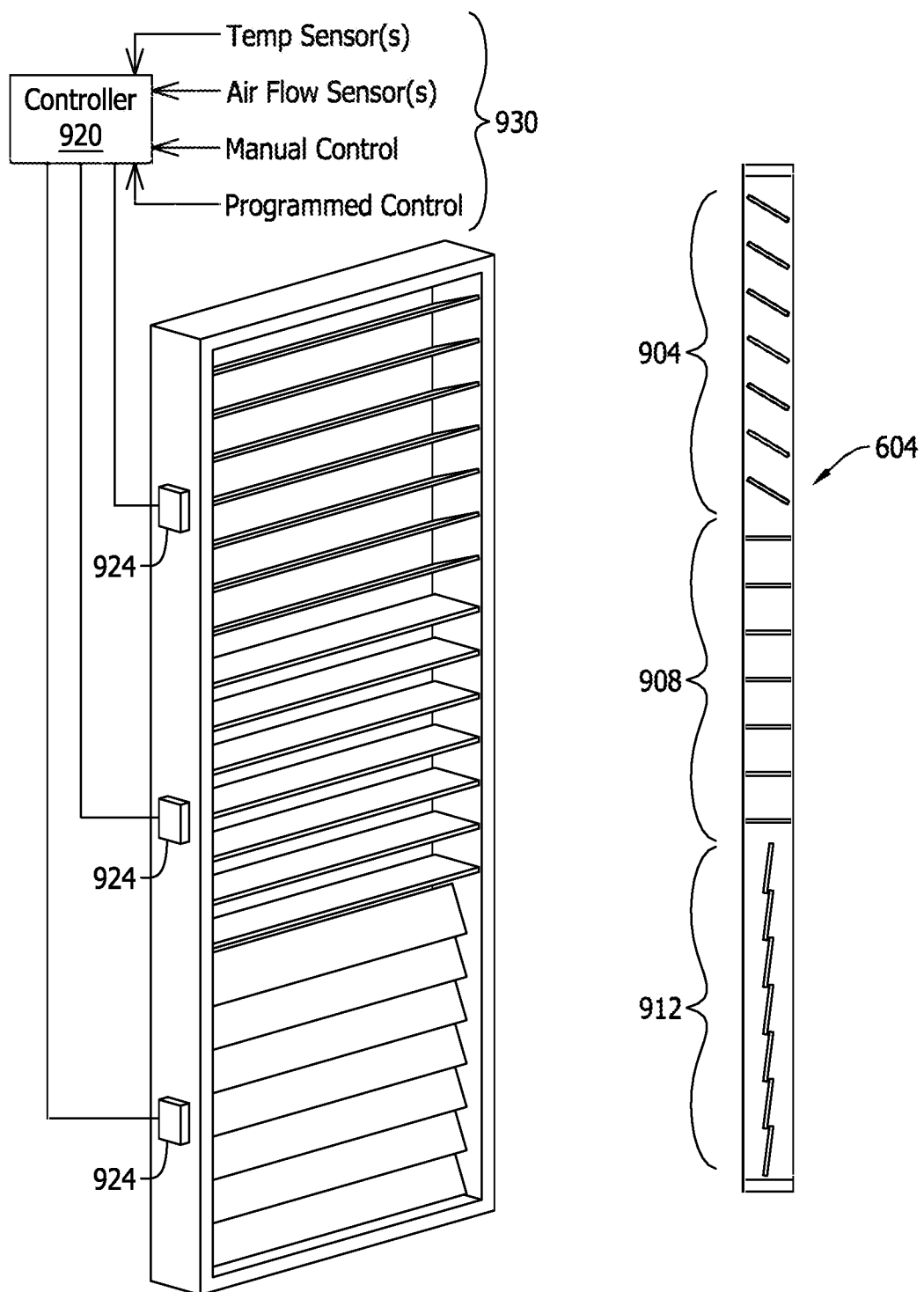
FIG. 9A illustrates a perspective view of louvers and frame.
FIG. 9B illustrates a side view of the louvers of FIG. 9A.

FIG. 9A illustrates a perspective view of louvers and frame. FIG. 9B illustrates a side view of the louvers. FIGS. 9A and 9B are discussed together. In FIGS. 9A and 9B, identical or similar items are labeled with identical reference numbers as compared to FIGS. 6A and 6B. It is contemplated that the louvers may be adjustable. As shown the louvers 608 are adjusted to different angles depending on the location of the louvers in the frame 604. Within a single frame 604 the louvers may be pointed in the upward direction 904, aligned horizontal 908 for maximum air flow, or shut 912 to inhibit or prevent air flow. It is also contemplated that some louvers may be removed thereby allowing free passage of some air flow (where there are no louvers) while directing other airflow upward based on the louver angle.

In this embodiment, it is contemplated that louvers 608 are not fixed, but are movable between positions. In this embodiment, the louvers are linked to or controlled by motors 924. A motor 924 may be dedicated to each louver 608 or multiple louvers may be controlled by a single motor. Any type motor and/or gear/arm assembly may be used. For example, an arm may extend vertically and connects to one or more louvers such that movement of the arm moves all the louvers which the arm connects. In one embodiment, a stepper motor is used to precisely control louver position.

The stepper motors 924 are controlled by a controller 920. The controller 920 may comprise a computer, processor, or any other control system. It is contemplated that memory may be associated with the controller 920 and the non-transitory memory stores non-transitory machine readable or executable code. The controller 920 may interface and communicate with the memory and thus be configured to execute non-transitory machine readable or executable code based on one or more inputs or settings. In one embodiment, the settings are stored in the memory and are user accessible and changeable thereby making the louver position user controllable. The louver position may also be based on input from one or more sensors data 930, such as from temperature sensors, airflow sensors, manual control by a user, or programmed control from an outside or secondary input. The temperature sensor may be located at any location inside the cabinets, on or near the electrical equipment in each cabinet, on or near the louvers, or at any location in the hot aisle. Likewise, the airflow sensors may be at any of the locations. By using sensor data to control louver position, a real time, dynamic feedback system is established that maintains cooling while concurrently minimizing energy use and air speed.

Figure 10:
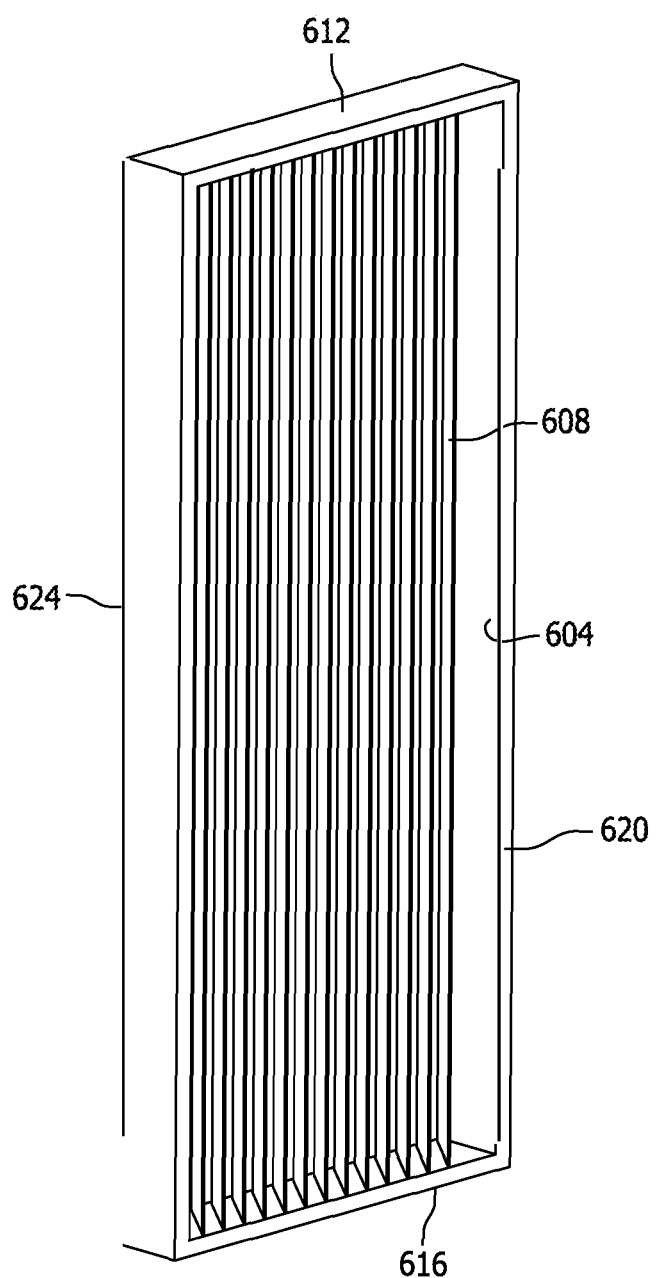
FIG. 10 illustrates an exemplary vertically aligned louver position.

FIG. 10 illustrates exemplary vertically aligned louver positions. In FIG. 10 identical or similar items are labeled with identical reference numbers as compared to FIGS. 6A and 6B. As shown, the louvers 608 are aligned vertically. As discussed above, the louvers may be fixed, manually adjustable, or automatically position controlled to different angles in the frame 604. Aligning the louvers vertically directs the air flow toward either the side of cabinet, such as if the hot air venting for the hot aisle were at a side of the hot aisle, and not the top of the hot aisle.

Figure 11:
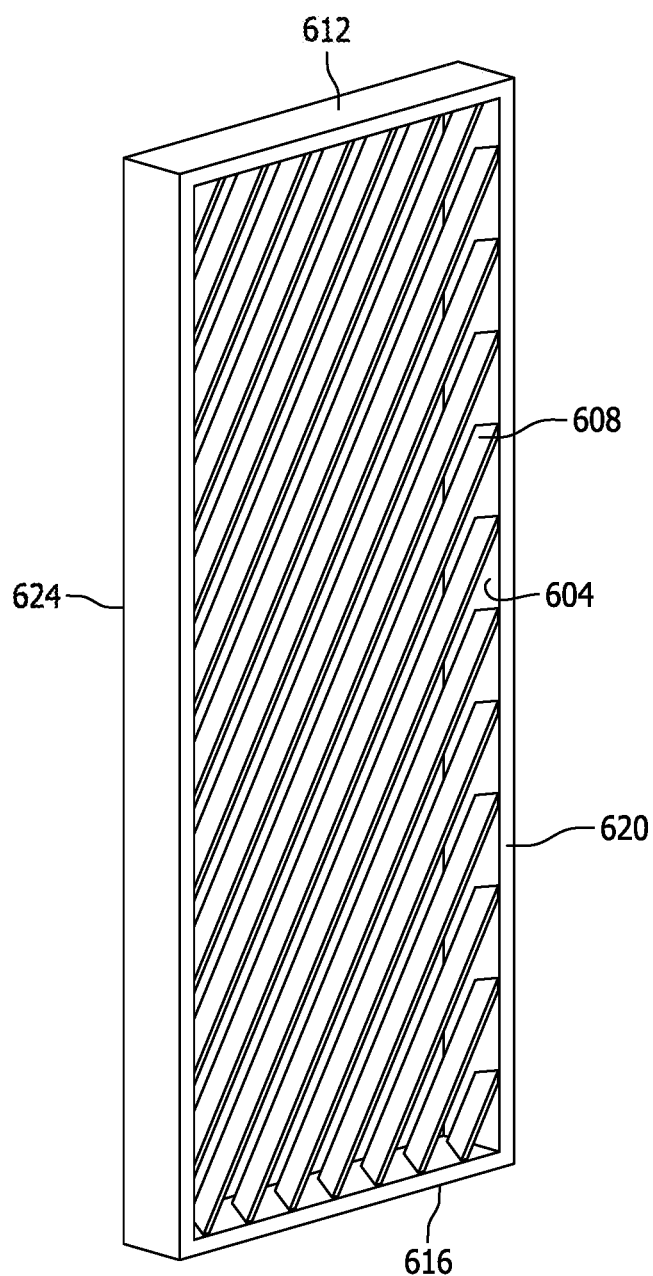
FIG. 11 illustrates an exemplary diagonally aligned louver position.

FIG. 11 illustrates exemplary diagonally aligned louver position. In FIG. 11 identical or similar items are labeled with identical reference numbers as compared to FIGS. 6A and 6B. As shown, the louvers 608 are aligned diagonally. As discussed above, the louvers may be fixed, manually adjustable, or automatically position controlled to different angles in the frame 604. Aligning the louvers diagonally directs the air flow diagonally out the back of the cabinet.

Figure 12:
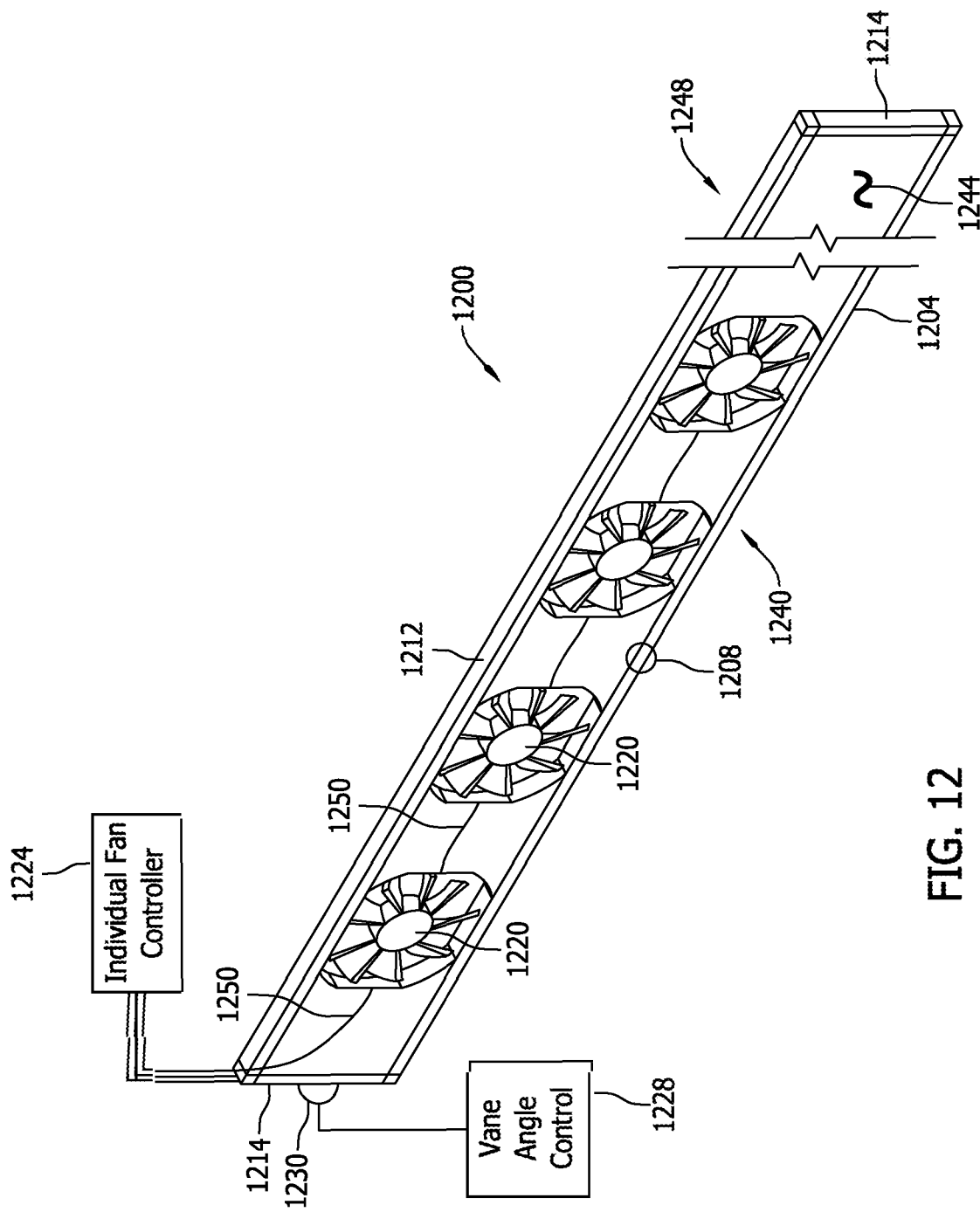
FIG. 12 illustrates an example louver having integrated fans.

FIG. 12 illustrates an example louver having integrated fans. This is but one possible arrangement of fans within a louver and other designs are possible that depart from that shown in FIG. 12. As shown, a louver 1200 includes a louver frame 1208 having a top 1212 and a bottom 1204 with two opposing sides 1212. The frame may be solid or partially open. One or more sections within the louver 1200 form openings 1240 that pass through the louver from the front size 1244 to the back side 1248. Although open for air flow, one or more screens, grates, or other elements may be disposed over the openings 1244.

Associated with the louver 1200 are fans 1220 that are aligned with the openings 1240 such that operation of the fan 1220 moves air through the opening from the backside 1248 of the louver to the front side of the louver 1244. Any type fan 1220 may be used that is sized to fit on a louver. Numerous computer fans are known in the art and as such the fan 1220 is not described in detail. The fan may be permanently mounted in the louver or connected with screws, bolts, clips or any other connector means. The louver 1200 may have one or more fans 1200 in the louver and if a fan is not mounted in an opening 1240, then the opening may be covered with a cover or other element to deflect and direct the airflow according to the position of the louver. The fans 1200 may be single speed, multispeed, or variable speed.

The position of the louver is determined by a louver angle control module 1228 that is configured to generate control signals which are provided to a motor 1230 or other position control device capable of moving the angle of the louver 1200. Any type controller 1228 and motor 1230 may be used as discussed therein. In addition, the controller 1228 and motor 1230 may control a single louver, a group of louvers, or all the louvers in the frame of louvers. In addition, it is contemplated that in the group of louvers at the back of a cabinet, one, a portion, or all of the louvers may have fans incorporated therein. For example, the bottom louvers, near the bottom of the cabinet, may have low air flow causing heat to accumulate and to address this issue the louvers at the bottom of cabinet may have fans installed to boost air flow and direct air flow upward.

Controlling and/or providing power to the fans 1220 are wires which connect to a fan controller 1224. In this embodiment, the fan controller 1224 is configured to individually control each fan's operation. In other embodiments, all the fans may function in a unified manner. The fan controller 1224 may receive input from other sources, such as sensors or user input. In one embodiment, a memory associated with the controller 1224 includes a table of stored temperatures for different sensor locations and a corresponding fan speed and/or louver angle. This may be referred to as a look up table. In other embodiments, one or more algorithms receive data regarding one or more of temperature, system computing load, air speed or flow, energy cost, time of day, and any other factor regarding the server room, cabinets, load, cabinets, or the cooling system to generate louver angle control signals and fan speed control signals.

Figure 13A:
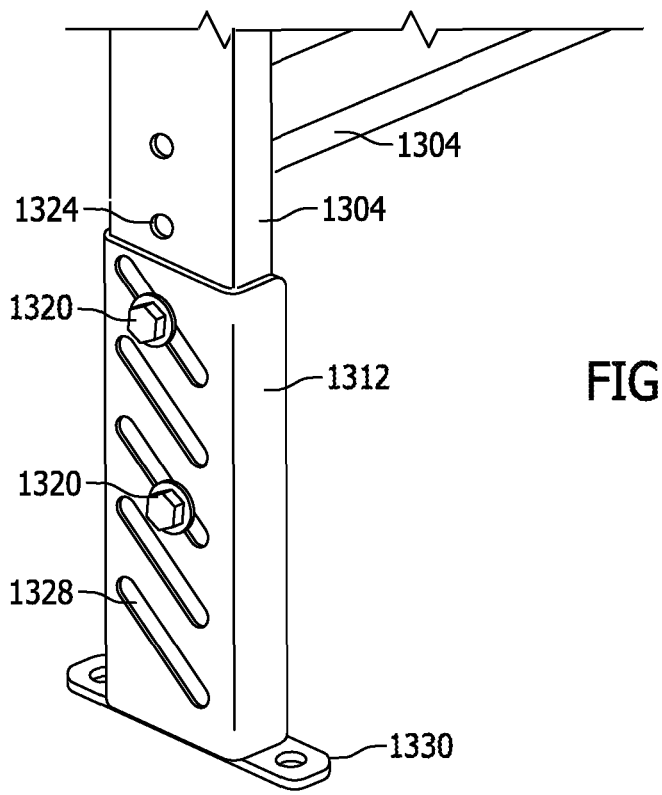
FIG. 13A and FIG. 13B illustrate exemplary adjustable legs for a frame containing louvers for use at the back of a cabinet.
Figure 13B:
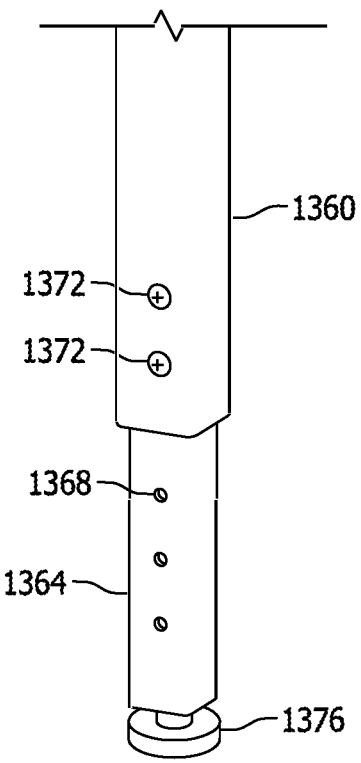

FIGS. 13A and 13B illustrates exemplary adjustable legs for a frame containing louvers for use at the back of a cabinet. In reference to FIG. 13A, the frame 1304 is configured to support the louvers. At or near the bottom of the frame 1304 is a leg 1312 that forms a C-channel configured to accept the frame 1304 therein. One or more bolts 1320 extend through one or more frame openings 1224 and one or more leg openings 1228. The bolts 1320 may be removed and the frame 1304 moved upward or downward in the C-channel of the leg 1312 to raise or lower the frame and louvers. To secure the frame 1304 to leg 1312 after height adjustment, the bolts 1320 are inserted through the openings 1324 and secure. Any other securing device other than bolts may also be used. In one embodiment the leg 1312 also includes feet 1330 with one or more openings there through to secure the leg to the floors, such as with bolts, pins or screws.

FIG. 13B illustrates an alternative embodiment of an adjustable height leg. In this embodiment, an upper leg 1360 cooperates with a lower leg 1364 to adjust the height of the upper leg 1360. In this embodiment the interior dimensions of the upper leg 1360 is greater than the out dimensions of the lower leg 1364 allowing the lower leg to fit within the upper leg. The upper leg 1360 and lower leg 1364 have two or more openings 1368 through which a bolt 1372 or other securing device is placed. In operation the upper leg 1360 may be moved relative to the lower leg 1364 to adjust the height of the upper leg and the frame. The bolt 1372 secures the upper leg 1360 in place relative to the lower leg 1364. Slip resistant feet 1376 may be placed at the bottom of the lower leg 1364.

Figure 14:
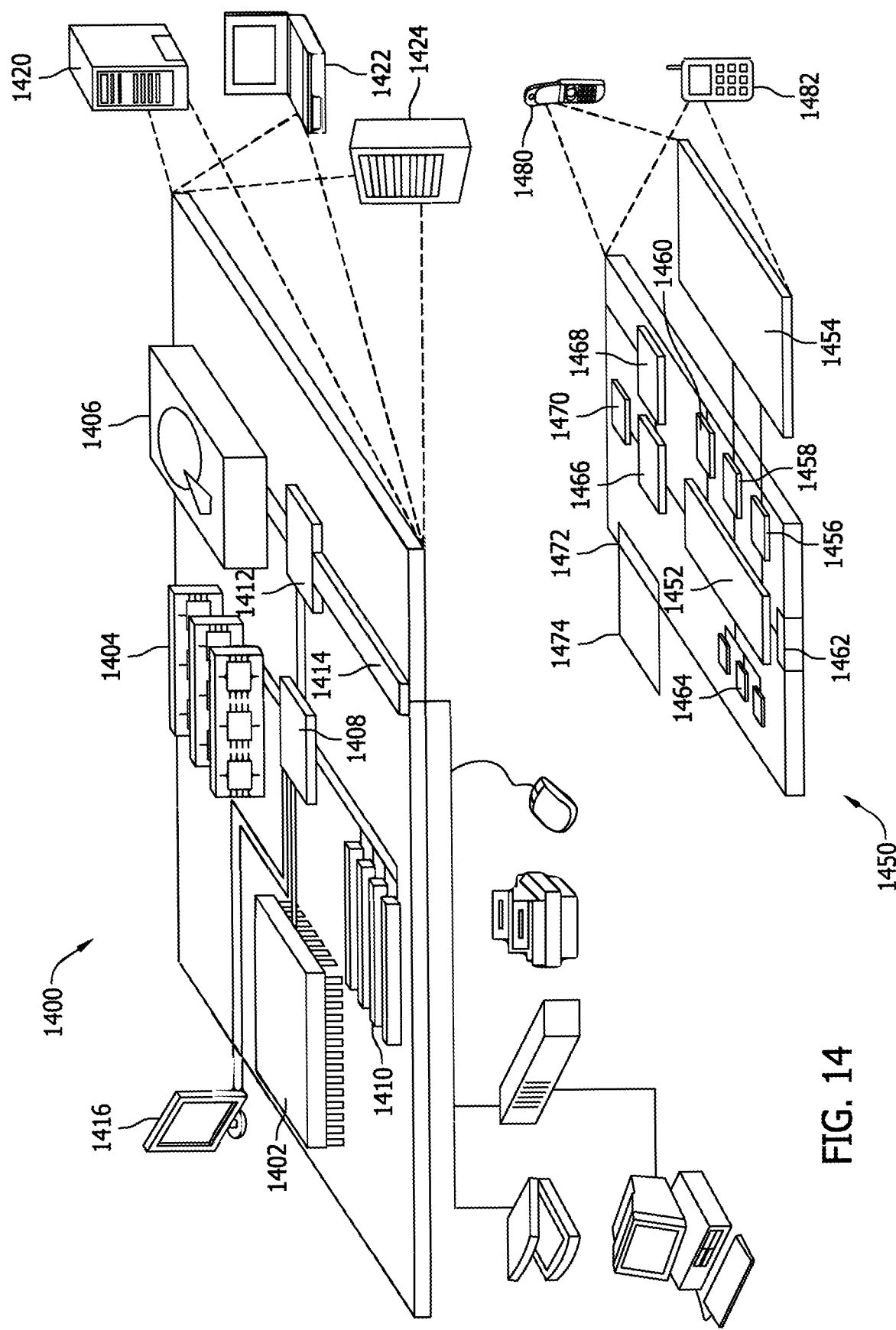
FIG. 14 is a block diagram showing example or representative computing devices and associated elements.

FIG. 14 is a block diagram showing example or representative computing devices and associated elements that may be used to implement the systems method and apparatus described herein. FIG. 14 shows an example of a generic computing device 1400A and a generic mobile computing device 1450A, which may be used with the techniques described here. Computing device 1400A is intended to represent various forms of digital computers, such as laptops, desktops, workstations, personal digital assistants, servers, blade servers, mainframes, and other appropriate computers. Computing device 1450A is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 1400A includes a processor 1402A, memory 1404A, a storage device 1406A, a high-speed interface or controller 1408A connecting to memory 1404A and high-speed expansion ports 1410A, and a low-speed interface or controller 1412A connecting to low-speed bus 1414A and storage device 1406A. Each of the components 1402A, 1404A, 1406A, 1408A, 1410A, and 1412A, are interconnected using various busses, and may be mounted on a common motherboard or in other manners as appropriate. The processor 1402A can process instructions for execution within the computing device 1400A, including instructions stored in the memory 1404A or on the storage device 1406A to display graphical information for a GUI on an external input/output device, such as display 1416A coupled to high-speed controller 1408A. In other implementations, multiple processors and/or multiple buses may be used, as appropriate, along with multiple memories and types of memory. Also, multiple computing devices 1400A may be connected, with each device providing portions of the necessary operations (e.g., as a server bank, a group of blade servers, or a multi-processor system).

The memory 1404A stores information within the computing device 1400A. In one implementation, the memory 1404A is a volatile memory unit or units. In another implementation, the memory 1404A is a non-volatile memory unit or units. The memory 1404A may also be another form of computer-readable medium, such as a magnetic or optical disk.

The storage device 1406A is capable of providing mass storage for the computing device 1400A. In one implementation, the storage device 1406A may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 1404A, the storage device 1406A, or memory on processor 1402A.

The high-speed controller 1408A manages bandwidth-intensive operations for the computing device 1400A, while the low-speed controller 1412A manages lower bandwidth-intensive operations. Such allocation of functions is exemplary only. In one implementation, the high-speed controller 1408A is coupled to memory 1404A, display 1416A (e.g., through a graphics processor or accelerator), and to high-speed expansion ports 1410A, which may accept various expansion cards (not shown). In the implementation, low-speed controller 1412A is coupled to storage device 1406A and low-speed bus 1414A. The low-speed bus 1414, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 1400A may be implemented in a number of different forms, as shown in the figure. For example, it may be implemented as a standard server 1420A, or multiple times in a group of such servers. It may also be implemented as part of a rack server system 1424A. In addition, it may be implemented in a personal computer such as a laptop computer 1422A. Alternatively, components from computing device 1400A may be combined with other components in a mobile device (not shown), such as device 1450A. Each of such devices may contain one or more of computing device 1400A, 1450A, and an entire system may be made up of multiple computing devices 1400A, 1450A communicating with each other.

Computing device 1450A includes a processor 1452A, memory 1464A, an input/output device, such as a display 1454A, a communication interface 1466A, and a transceiver 1468A, among other components. The device 1450A may also be provided with a storage device, such as a microdrive or other device, to provide additional storage. Each of the components 1450A, 1452A, 1464A, 1454A, 1466A, and 1468A, are interconnected using various buses, and several of the components may be mounted on a common motherboard or in other manners as appropriate.

The processor 1452A can execute instructions within the computing device 1450A, including instructions stored in the memory 1464A. The processor may be implemented as a chipset of chips that include separate and multiple analog and digital processors. The processor may provide, for example, for coordination of the other components of the device 1450A, such as control of user interfaces, applications run by device 1450A, and wireless communication by device 1450A.

Processor 1452A may communicate with a user through control interface 1458A and display interface 1456A coupled to a display 1454A. The display 1454A may be, for example, a TFT LCD (Thin-Film-Transistor Liquid Crystal Display) or an OLED (Organic Light Emitting Diode) display, or other appropriate display technology. The display interface 1456A may comprise appropriate circuitry for driving the display 1454A to present graphical and other information to a user. The control interface 1458A may receive commands from a user and convert them for submission to the processor 1452A. In addition, an external interface 1462A may be provided in communication with processor 1452A, so as to enable near area communication of device 1450A with other devices. External interface 1462A may provide, for example, for wired communication in some implementations, or for wireless communication in other implementations, and multiple interfaces may also be used.

The memory 1464A stores information within the computing device 1450A. The memory 1464A can be implemented as one or more of a computer-readable medium or media, a volatile memory unit or units, or a non-volatile memory unit or units. Expansion memory 1474A may also be provided and connected to device 1450A through expansion interface 1472A, which may include, for example, a SIMM (Single In Line Memory Module) card interface. Such expansion memory 1474A may provide extra storage space for device 1450A, or may also store applications or other information for device 1450A. Specifically, expansion memory 1474A may include instructions to carry out or supplement the processes described above, and may include secure information also. Thus, for example, expansion memory 1474A may be provide as a security module for device 1450A, and may be programmed with instructions that permit secure use of device 1450A. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 1464A, expansion memory 1474A, or memory on processor 1452A, that may be received, for example, over transceiver 1468A or external interface 1462A.

Device 1450A may communicate wirelessly through communication interface 1466A, which may include digital signal processing circuitry where necessary. Communication interface 1466A may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 1468A. In addition, short-range communication may occur, such as using a Bluetooth, Wi-Fi, or other such transceiver (not shown). In addition, GPS (Global Positioning system) receiver module 1470A may provide additional navigation- and location-related wireless data to device 1450A, which may be used as appropriate by applications running on device 1450.

Device 1450A may also communicate audibly using audio codec 1460, which may receive spoken information from a user and convert it to usable digital information. Audio codec 1460A may likewise generate audible sound for a user, such as through a speaker, e.g., in a handset of device 1450A. Such sound may include sound from voice telephone calls, may include recorded sound (e.g., voice messages, music files, etc.) and may also include sound generated by applications operating on device 1450A.

The computing device 1450A may be implemented in a number of different forms, as shown in the figure. For example, it may be implemented as a cellular telephone 1480A. It may also be implemented as part of a smart phone 1482A, personal digital assistant, a computer tablet, or other similar mobile device.

Thus, various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system (e.g., computing device 1400A and/or 1450A) that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

In the example embodiment, computing devices 1400A and 1450A are configured to receive and/or retrieve electronic signal and commands from various other computing devices connected to computing devices 1400A and 1450A through a communication network, and store these electronic signals within at least one of memory 1404A, storage device 1406A, and memory 1464A. Computing devices 1400A and 1450A are further configured to manage and organize these electronic signals within at least one of memory 1404A, storage device 1406A, and memory 1464A using the techniques described herein.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

Figure 15:
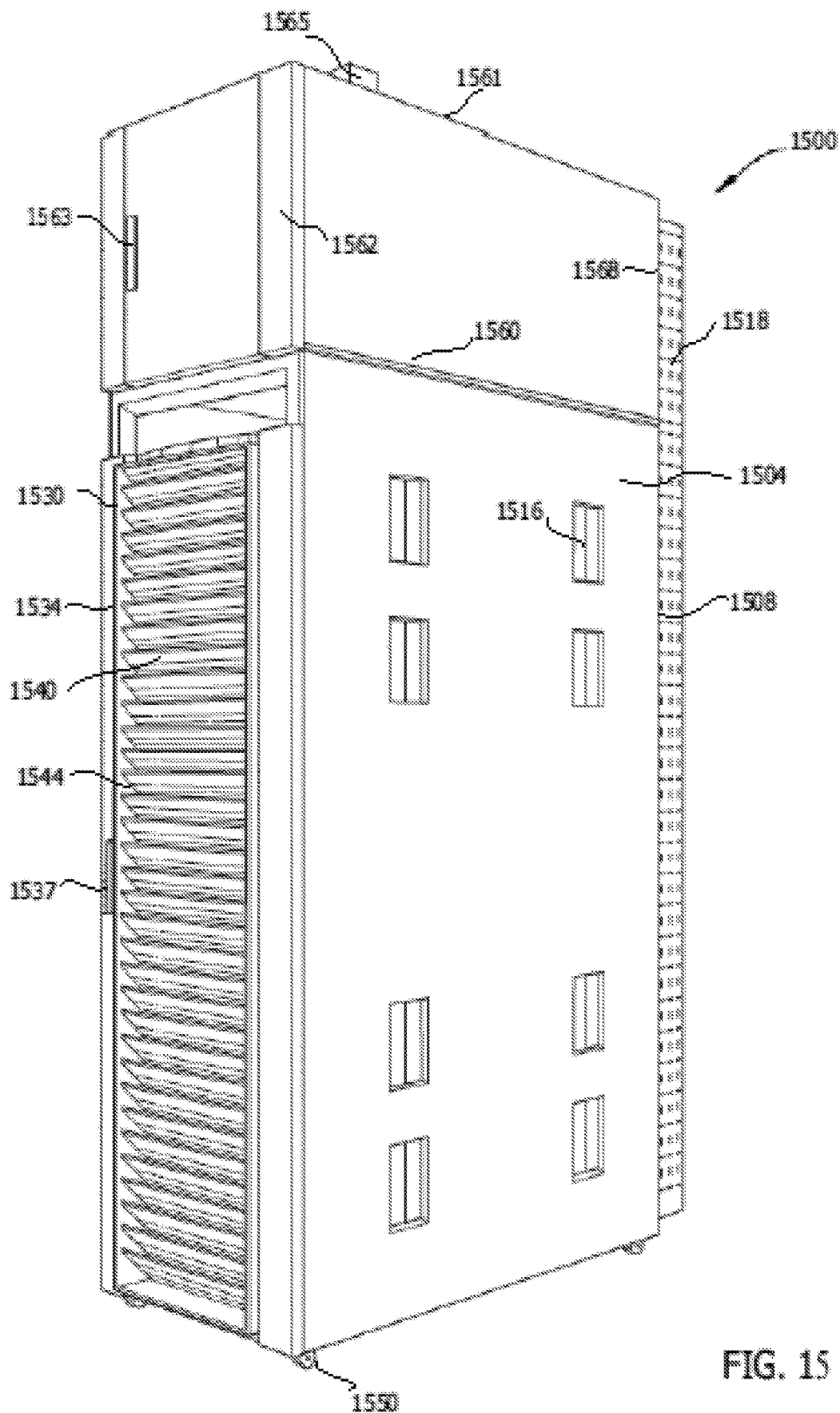
FIG. 15 illustrates a preferred embodiment of the cabinet with a back mounted louver door.

FIG. 15 illustrates a preferred embodiment of the cabinet with back mounted louvers and a top compartment for housing heat sensitive equipment. This is but one possible embodiment and as such it is contemplated that one of ordinary skill in the art will arrive at different embodiments which do not depart from the claims that follow. In this embodiment a cabinet 1500 is shown with two opposing side panels 1504 and a top side 1561 and bottom side 1551. The top side 1561 and bottom side 1551 may be formed by the same material as the sides 1504 or formed by a ceiling and floor respectively. The cabinet has a front side 1508 and a rear or back side 1512. The sides 1504, top 1561, bottom 1551, front 1508 and back 1512 define an interior. The interior is divided into first and second compartments (1581 and 1582 respectively) configured to house heat generating electrical equipment (including but not limited to servers) and heat sensitive equipment (including but not limited to switching gear). The first compartment 1581 and second compartment 1582 are separated by a thermal barrier 1560 located within the cabinet 1500 substantially parallel to the top side 1561 and bottom side 1551. The thermal barrier 1560 divides the interior space of the cabinet 1500 into lower and upper compartments allowing the heat generating electrical equipment and heat sensitive equipment to occupy separate spaces maintained at different temperatures and pressures within the housing. The thermal barrier 1560 may be comprised of one or more panels having one or more layers of insulating material. In one embodiment, the thermal barrier further includes one or more fans configured to conduct flow away from the compartment housing the heat sensitive equipment. In the embodiment shown in FIG. 15, heat generating electrical equipment such as servers are housed within the first (lower) compartment 1581 while heat sensitive equipment such as switchgear is housed within the second (upper) compartment 1582. The sides 1504 of the cabinets 1500 may have side openings 1516 to allow for wires, pipes, conduits or other elements to access the interior of the cabinet.

Figure 16:
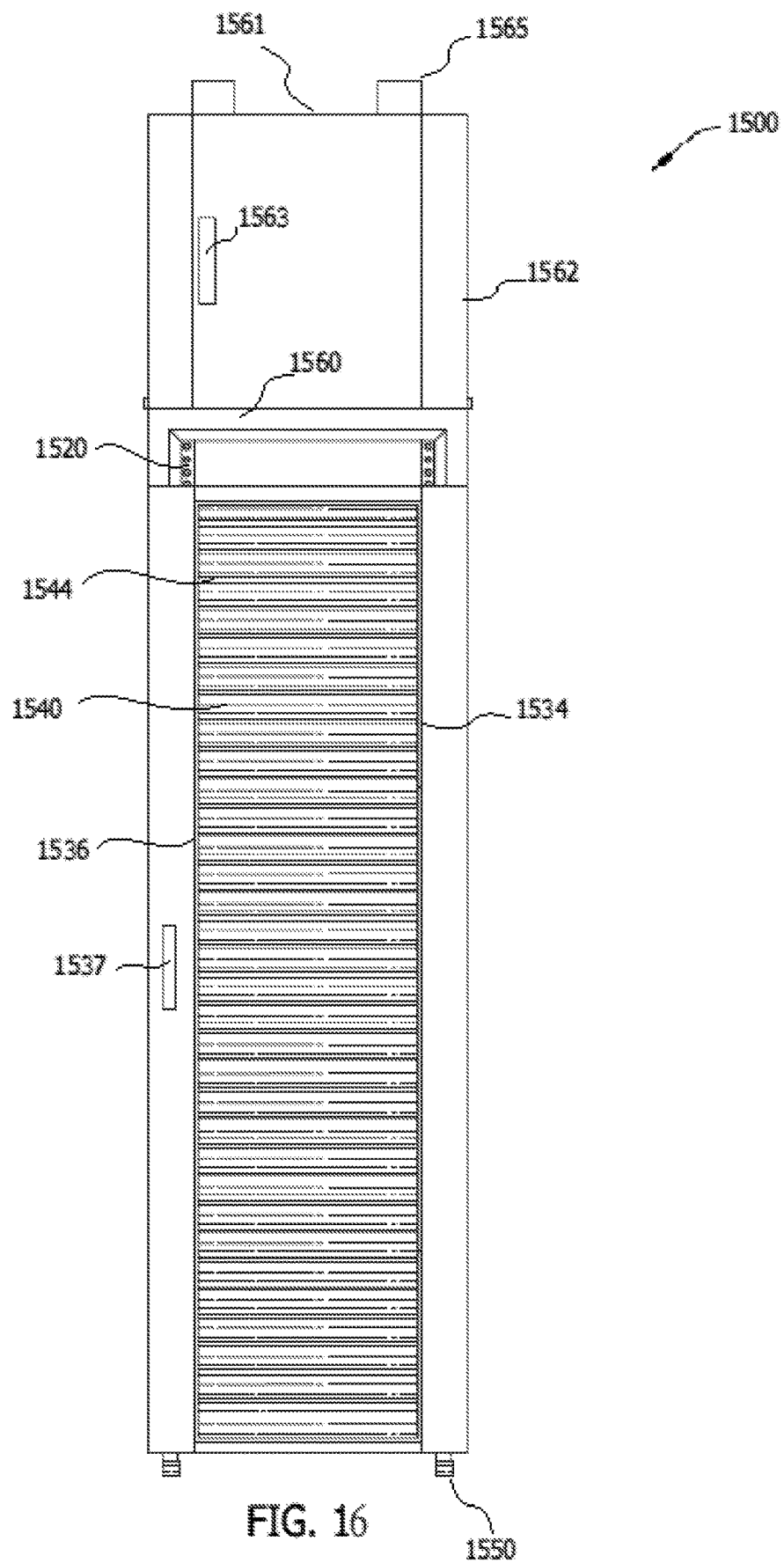
FIG. 16 illustrates a rear perspective view of the cabinet of FIG. 15.

As shown in FIG. 16, the cabinet 1500 may include brackets 1520 or mounting points on the interior of the cabinet 1500 to support and secure the electrical equipment. Mounted at the back of the cabinets 1500 is a frame 1530 having a first frame side 1534 and a second frame side 1536. The frame 1530 may optionally include a top frame portion and bottom frame portion. Mounted between the first frame side 1534 and the second frame side 1536 are louvers 1540 that are angled upward to direct the air flow from the rear of the cabinets upward. Between each louver 1540 is an open space 1544 which allows for the passage of air. The louvers 1540 may be at any angle. As discussed above in greater detail, the louvers may be fixed in position, as shown in FIG. 5, or movable to thereby adjust the direction of the air flow and the size of the openings 1544. If adjustable, the louvers 1540 may pivot about a central pin (not shown) or axis, in an arced recess, or in any other way now known in the art or develop in the future.

The louvers cause heated air flowing from the back side of the first compartment 1581 of the cabinet 1500 to be angled upwards toward second compartment 1582. The rear side of the second compartment 1582 is sealed by a heat insulated second compartment door 1562. Second compartment door 1562 may be made with the same material as sides 1504 and like, the thermal barrier 1560, may be comprised of one or more panels having one or more layers of insulating material. Second compartment door handle 1563 may be used to selectively open the second compartment door 1562. Second compartment door 1562 may be attached to the rear side of the second compartment 1582 by hinges or any suitable means of attachment. When second compartment door 1562 is in a closed configuration the first compartment 1582 is thermally sealed from heat flowing from the rear of first compartment 1581 thereby protecting heat sensitive equipment housed within the second compartment 1582. Openings 1565 at the top of the cabinet are positioned in the cold aisle to expose and allow cool air to flow into the second compartment 1582 from the front side 1568 and through the openings 1565. While FIG. 16 shows the first compartment 1581 positioned below the second compartment 1582, other embodiments of the cabinet 1500 may reverse this orientation placing the first compartment 1581 above the second compartment 1582.

At the bottom of the frame 1530 are wheels 1550 that support the frame on a floor. The wheels 1550 may be of fixed height, or adjustable in height to move the frame 1530 and associated louvers 1540 upward or downward to align with the cabinet. Although not shown in this embodiment, it is contemplated that the frame may also have rails as part of the frame that expand the height of the frame. This may be useful if the cabinet height changes or if different height cabinets are in use or to expand the frame and louver dimensions to cover the full height or width of the back side of the cabinet, other structure or any opening. The wheels 1550 or frame 1530 may mount to the floor to provide a more secure attachment.

One or more brackets 1560 may be attached to or be integral with the frame 1530 to attach the frame (and louvers) to the back of the cabinet 1500. Bolts, screws, magnetics, slots, clips, rails or any other fastener may be used to secure the frame 1530 to the cabinet 1500. It is also contemplated that hinges may be used to connect the frame(s) (and louvers) to the cabinets. Hinges allow the frame to swing out of the way for access to the back of the cabinet.

In operation, the air exiting the back of the cabinet 1500 hits the louvers 1540 and is directed upward (or in any direction based on the louvers). When arranged as rows of cabinets as shown in FIG. 2, the louvers angled upward eliminate the air flow from the back to back cabinets being opposing and thereby preventing dead spots and eddies. This in turn increases cooling efficiency and effectiveness.

Figure 17:
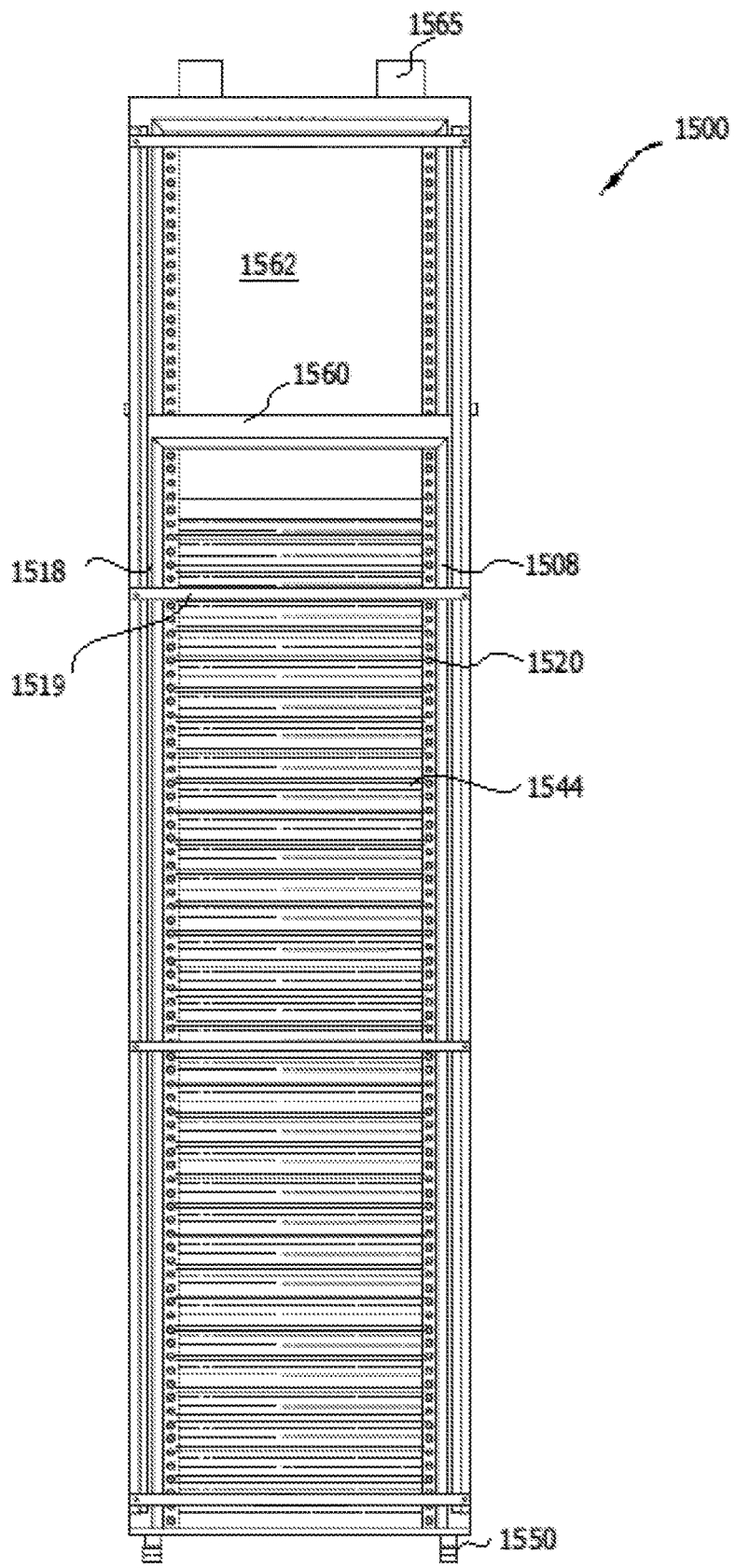
FIG. 17 illustrates a front perspective view of the cabinet of FIG. 15.

FIG. 17 shows the open front side of the cabinet 1500. Connection panels 1518 are attached to both sides 1504 of the cabinet 1500. Connection panels 1518 are provided with perforations and connectors allowing wires, ties, and/or cables to be held in place in a convenient position that allows simple access to equipment stored in the cabinet 1500. Connection brackets 1519 may be attached to or be integral with the connection panels 1518 to attach the connection panels to the front of the cabinet 1500. Bolts, screws, magnetics, slots, clips, rails or any other fastener may be used to secure the connection panels 1518 to the cabinet 1500. Brackets 1520 or mounting points on the interior of the cabinet 1500 support and secure the electrical equipment. One or more temperature sensors may be placed within the first compartment 1581 and one or more temperature sensors may be placed within the second compartment 1582. The temperature sensors may be used to measure read temperature signals received from the temperature sensors to calculate an optimal fan speed, and control a fan speed of the one or more fans to conduct heated air away from the heat sensitive equipment. In another embodiment of the invention, one or more pressure or humidity sensors located in the first compartment 1581 and second compartment 1582 may provide data to the fan control system to calculate an optimal fan speed, and control a fan speed of the one or more fans to conduct heated air away from the heat sensitive equipment in response to elevated or decreased pressure differentials or humidity.

The invention teaches methods of controlling air flow direction and heat separation for electronic equipment. By these methods, cabinets are positioned defining a cabinet interior space on a floor. A thermal barrier is positioned within the cabinet interior space that separates the cabinet interior space into a first compartment and a second compartment. A front side of the first compartment is provided with one or more openings to accept flow of intake air into the first compartment and a rear side of the first compartment is provided with one or more openings for exit of exhaust air from the first compartment. A front side of the second compartment is provided with one or more openings to accept flow of intake air into the second compartment and a rear side of the second compartment is provided with a thermal seal to prevent exhaust air from the first compartment from entering the second compartment. Heat generating electrical equipment is placed within the first compartment. Heat sensitive gear is placed within the second compartment. Intake air flow is conducted into the first compartment. The intake air is then heated by the heat generating electrical equipment. The heated intake air is then conducted away from the heat generating electrical equipment as exhaust air. Exhaust air is conducted out of the rear side of the first compartment. The flow of exhaust air is prevented from entering the second compartment by the thermal barrier and thermal seal. The second compartment is located above or below the first compartment relative to the floor. The thermal barrier is comprised of at least one layer of heat insulating material. The cabinet is comprised of a plurality of exterior panels. The space within the exterior panels defines the cabinet interior space. Each of the plurality of exterior panels comprises at least one layer of heat insulating material. The thermal seal is configured to be selectively opened.

The methods of controlling air flow direction and heat separation for electronic equipment further comprise steps wherein a frame is positioned adjacent a rear side of the cabinet. The frame has a first frame side and a second frame side. Two or more louvers are positioned adjacent the rear side of the cabinet and extending between the first frame side and the second frame side. At least one louver has at least one face positioned at an angle to direct exhaust air exiting the first compartment interior space in a direction other than perpendicular to the rear side of the cabinet. Two or more wheels are connected to the frame, the two or more wheels cooperate with the frame to adjust a height of the frame in relation to the floor. The frame is releasably connected to the cabinet adjacent the cabinet rear side. Two or more louvers are affixed to the frame thereby fixing the angle associated with the louvers. Two or more louvers are movable in relation to the frame from a first position to a second position, the first position establishing a first louver angle and the second position establishing a second louver angle. At least one motor is provided at at least one frame side. The at least one motor is responsive to a control signal to change the angle of at least one louver. A first group of the two or more louvers may be positioned at a first angle and a second group of the two or more louvers may be positioned at a second angle.

It is also contemplated that the louvers may be located on the ceilings, roof areas, or the top sections of any element or component. For example, the position adjustable louvers may be located on the cool air vents to control the flow of cool air into the data center, such as the cool aisle area, or to direct more cool air to certain areas and less cool air to other areas. In addition, the adjustable louver may be located on a roof or ceiling to control the flow of hot or cool air into our out of any space that is part of or associated with the data center. As describe above, the adjustable louver may be fully open, fully closed, or adjustable to any position therebetween. The louvers may also be associated with a condenser, air exchanger, air conditioner, or any other heating or ventilation unit. In one embodiment, the hot air exhaust is used in connection with or directed by adjustable louvers to melt snow or ice from a roof structure or other portion of a building. It is contemplated that snow or ice may be melted with the heated air directed to a snowy or icy area.

It will be appreciated that the above embodiments that have been described in detail are merely example or possible embodiments, and that there are many other combinations, additions, or alternatives that may be included. For example, while online gaming has been referred to throughout, other applications of the above embodiments include online or web-based applications or other cloud services.

Also, the particular naming of the components, capitalization of terms, the attributes, data structures, or any other programming or structural aspect is not mandatory or significant, and the mechanisms that implement the invention or its features may have different names, formats, or protocols. Further, the system may be implemented via a combination of hardware and software, as described, or entirely in hardware elements. Also, the particular division of functionality between the various system components described herein is merely exemplary, and not mandatory; functions performed by a single system component may instead be performed by multiple components, and functions performed by multiple components may instead be performed by a single component.

Some portions of above description present features in terms of algorithms and symbolic representations of operations on information. These algorithmic descriptions and representations may be used by those skilled in the data processing arts to most effectively convey the substance of their work to others skilled in the art. These operations, while described functionally or logically, are understood to be implemented by computer programs. Furthermore, it has also proven convenient at times, to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "identifying" or "displaying" or "providing" or the like, refer to the action and processes of a computer system, or similar electronic computing device, that manipulates and transforms data represented as physical (electronic) quantities within the computer system memories or registers or other such information storage, transmission or display devices.

Based on the foregoing specification, the above-discussed embodiments of the invention may be implemented using computer programming or engineering techniques including computer software, firmware, hardware or any combination or subset thereof. Any such resulting program, having computer-readable and/or computer-executable instructions, may be embodied or provided within one or more computer-readable media, thereby making a computer program product, i.e., an article of manufacture, according to the discussed embodiments of the invention. The computer readable media may be, for instance, a fixed (hard) drive, diskette, optical disk, magnetic tape, semiconductor memory such as read-only memory (ROM) or flash memory, etc., or any transmitting/receiving medium such as the Internet or other communication network or link. The article of manufacture containing the computer code may be made and/or used by executing the instructions directly from one medium, by copying the code from one medium to another medium, or by transmitting the code over a network.

While the disclosure has been described in terms of various specific embodiments, it will be recognized that the disclosure can be practiced with modification within the spirit and scope of the claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. An apparatus positioned on a floor for storing electronic equipment with associated air flow direction control and heat separation system comprising:

a cabinet comprising a cabinet front side, a cabinet rear side, a cabinet roof side, a cabinet floor side, a cabinet first side and a cabinet second side;

the cabinet front side, cabinet rear side, cabinet roof side, cabinet floor side, cabinet first side and cabinet second side defining a cabinet interior space;

a thermal barrier comprising a thermal barrier top side and a thermal barrier bottom side, the thermal barrier positioned within the cabinet interior space between, and substantially parallel to, the cabinet roof side and the cabinet floor side;

one or more fans configured to be placed on the thermal barrier to conduct flow of exhaust air from the first compartment interior space out of the first compartment rear side;

one or more first compartment sensors in the first compartment interior space and one or more second compartment sensors in the second compartment interior space; and a fan control system configured to read sensor signals received from the one or more first compartment sensors and the one or more second compartment sensors, calculate an optimal fan speed, and control a fan speed of the one or more fans to increase or decrease a rate of the flow of the exhaust air from the first compartment interior space out of the first compartment rear side;

the thermal barrier separating the cabinet interior space into a first compartment and a second compartment;

the cabinet front side comprising a first compartment front side and a second compartment front side;

the cabinet rear side comprising a first compartment rear side and a second compartment rear side;

the first compartment front side, first compartment rear side, thermal barrier bottom side, cabinet floor side, cabinet first side, and cabinet second side defining a first compartment interior space configured to house heat generating electrical equipment;

the second compartment front side, second compartment rear side, thermal barrier top side, cabinet first side, and cabinet second side defining a second compartment interior space configured to house heat sensitive gear;

the first compartment front side having one or more openings to accept flow of intake air into the first compartment interior space and the first compartment rear side having one or more openings for exit of the exhaust air from the first compartment interior space;

the second compartment front side having one or more openings to accept flow of the intake air into the second compartment interior space and the second compartment rear side having a thermal seal to prevent the exhaust air from the first compartment interior space from entering the second compartment interior space.

2. The apparatus of claim 1 wherein the thermal barrier is configured to prevent the exhaust air from entering the second compartment interior space.

3. The apparatus of claim 1 wherein the one or more first compartment sensors in the first compartment interior space and the one or more second compartment sensors in the second compartment interior space are each temperature sensors.

4. The apparatus of claim 1 wherein the one or more first compartment sensors in the first compartment interior space and the one or more second compartment sensors in the second compartment interior space are each pressure sensors.

5. The apparatus of claim 1 wherein the cabinet roof side has one or more openings.

6. The apparatus of claim 1 wherein the thermal barrier comprises at least one layer of heat insulating material.

7. The apparatus of claim 1 wherein each of the cabinet roof side, cabinet floor side, cabinet first side and cabinet second side comprise at least one layer of heat insulating material.

8. The apparatus of claim 1 wherein the thermal seal is configured to be selectively opened.

9. The apparatus of claim 1 wherein the thermal seal comprises at least one layer of heat insulating material.

10. An apparatus positioned on a floor for storing electronic equipment with associated air flow direction control and heat separation system comprising:
a cabinet defining a cabinet interior space;
a thermal barrier positioned within the cabinet interior space separating the cabinet interior space into a first compartment and a second compartment;
the first compartment configured to house heat generating electrical equipment;
the second compartment configured to house heat sensitive gear;
a front side of the first compartment having one or more openings to accept flow of intake air into the first compartment and a rear side of the first compartment having one or more openings for exit of exhaust air from the first compartment;
a front side of the second compartment having one or more openings to accept flow of the intake air into the second compartment and a rear side of the second compartment having a thermal seal to prevent the exhaust air from the first compartment from entering the second compartment;
one or more fans configured to be placed on the thermal barrier to conduct flow of the exhaust air from the first compartment interior space out of the first compartment rear side;
one or more first compartment sensors in the first compartment interior space and one or more second compartment sensors in the second compartment interior space; and
a fan control system configured to read sensor signals received from the one or more first compartment sensors and the one or more second compartment sensors, calculate an optimal fan speed, and control a fan speed of the one or more fans to increase or decrease a rate of the flow of the exhaust air from the first compartment interior space out of the first compartment rear side.

11. The apparatus of claim 10 wherein the second compartment is positioned above the first compartment relative to the floor.

12. The apparatus of claim 10 wherein a top side of the second compartment has one or more openings.

13. The apparatus of claim 10 wherein the thermal barrier comprises at least one layer of heat insulating material.

14. The apparatus of claim 10 wherein the cabinet is comprised of a plurality of exterior panels, a space within the exterior panels defining the cabinet interior space, and each of the plurality of exterior panels comprises at least one layer of heat insulating material.

15. The apparatus of claim 10 wherein the thermal seal is configured to be selectively opened.

16. The apparatus of claim 10 wherein the one or more first compartment sensors in the first compartment interior space and the one or more second compartment sensors in the second compartment interior space are each temperature sensors.

17. The apparatus of claim 10 wherein the one or more first compartment sensors in the first compartment interior space and the one or more second compartment sensors in the second compartment interior space are each pressure sensors.

18. A method of controlling air flow direction and heat separation for electronic equipment comprising:
positioning a cabinet defining a cabinet interior space on a floor, the cabinet comprising a thermal barrier positioned within the cabinet interior space that separates the cabinet interior space into a first compartment and a second compartment;
a front side of the first compartment having one or more openings to accept flow of intake air into the first compartment and a rear side of the first compartment having one or more openings for exit of exhaust air from the first compartment;
a front side of the second compartment having one or more openings to accept flow of the intake air into the second compartment and a rear side of the second compartment having a thermal seal to prevent the exhaust air from the first compartment from entering the second compartment;
placing one or more fans on the thermal barrier to conduct flow of the exhaust air from the first compartment interior space out of the first compartment rear side;
disposing one or more first compartment sensors in the first compartment interior space and one or more second compartment sensors in the second compartment interior space;
providing a fan control system configured to read sensor signals received from the one or more first compartment sensors and the one or more second compartment sensors, calculate an optimal fan speed, and control a fan speed of the one or more fans to increase or decrease a rate of the flow of the exhaust air from the first compartment interior space out of the first compartment rear side;
placing heat generating electrical equipment within the first compartment;
placing heat sensitive gear within the second compartment; and
conducting flow of the intake air into the first compartment, the intake air then being heated by the heat generating electrical equipment, the heated intake air then being conducted away from the heat generating electrical equipment as the exhaust air.

19. The method of claim 18 wherein the one or more first compartment sensors in the first compartment interior space and the one or more second compartment sensors in the second compartment interior space are each temperature sensors.

20. The method of claim 18 wherein the one or more first compartment sensors in the first compartment interior space and the one or more second compartment sensors in the second compartment interior space are each pressure sensors.

\* \* \* \* \*